(12) United States Patent
Wang

(10) Patent No.: US 9,391,026 B2
(45) Date of Patent: Jul. 12, 2016

(54) SEMICONDUCTOR PACKAGES AND METHODS OF PACKAGING SEMICONDUCTOR DEVICES

(71) Applicant: UNITED TEST AND ASSEMBLY CENTER LTD., Singapore (SG)

(72) Inventor: Chuen Khiang Wang, Singapore (SG)

(73) Assignee: UTAC HEADQUARTERS PTE. LTD., Singapore (SG)

( * ) Notice: Subject to any disclaimer, the term of this patent is extended or adjusted under 35 U.S.C. 154(b) by 0 days.

(21) Appl. No.: 14/561,157

(22) Filed: Dec. 4, 2014

(65) Prior Publication Data

US 2015/0084197 A1    Mar. 26, 2015

Related U.S. Application Data

(62) Division of application No. 13/831,964, filed on Mar. 15, 2013, now Pat. No. 8,916,422.

(51) Int. Cl.
| | | |
|---|---|---|
| *H01L 23/31* | (2006.01) | |
| *H01L 23/498* | (2006.01) | |
| *H01L 23/538* | (2006.01) | |
| *H01L 21/56* | (2006.01) | |
| *H01L 21/48* | (2006.01) | |
| *H01L 23/28* | (2006.01) | |
| *H05K 1/09* | (2006.01) | |
| *H05K 1/11* | (2006.01) | |

(52) U.S. Cl.
CPC ........ *H01L 23/5384* (2013.01); *H01L 21/4832* (2013.01); *H01L 21/56* (2013.01); *H01L 21/568* (2013.01); *H01L 23/28* (2013.01); *H01L 23/49811* (2013.01); *H01L 23/49816* (2013.01); *H01L 23/49827* (2013.01); *H01L 23/49866* (2013.01); *H05K 1/09* (2013.01); *H05K 1/115* (2013.01); *H01L 23/3128* (2013.01); *H01L 2224/32225* (2013.01); *H01L 2224/48091* (2013.01); *H01L 2224/48227* (2013.01); *H01L 2224/73265* (2013.01); *H01L 2924/1461* (2013.01); *H01L 2924/15311* (2013.01)

(58) Field of Classification Search
CPC . H01L 23/28; H01L 23/3107; H01L 23/3121; H01L 23/3128; H01L 23/49816; H01L 21/56
See application file for complete search history.

(56) References Cited

U.S. PATENT DOCUMENTS

| | | |
|---|---|---|
| 7,064,012 B1 | 6/2006 | Lin |
| 7,749,809 B2 | 7/2010 | How et al. |
| 7,863,757 B2 | 1/2011 | How et al. |

(Continued)

FOREIGN PATENT DOCUMENTS

WO    2011026261    3/2011

*Primary Examiner* — Phat X Cao
(74) *Attorney, Agent, or Firm* — Horizon IP Pte. Ltd.

(57) ABSTRACT

Package substrate, semiconductor packages and methods for forming a semiconductor package are presented. The package substrate includes a base substrate having first and second major surfaces and a plurality of via contacts extending through the first to the second major surfaces of the base substrate. A first conductive layer having a plurality of openings is disposed over the first surface of the base substrate and via contacts. The openings are configured to match conductive trace layout of the package substrate. Conductive traces are disposed over the first conductive layer. The conductive traces are directly coupled to the via contacts through some of the openings of the first conductive layer.

20 Claims, 20 Drawing Sheets

(56) References Cited

U.S. PATENT DOCUMENTS

| | | |
|---|---|---|
| 8,072,053 B2 | 12/2011 | Li |
| 2011/0001224 A1 | 1/2011 | San Antonio et al. |
| 2011/0147931 A1 | 6/2011 | Nondhasitthichai et al. |
| 2011/0198752 A1 | 8/2011 | Nondhasitthichai et al. |
| 2012/0091569 A1 | 4/2012 | Appelt et al. |
| 2012/0119342 A1 | 5/2012 | Chang Chien et al. |
| 2013/0083503 A1* | 4/2013 | Lai ................. H05K 3/0097 361/783 |
| 2013/0154072 A1* | 6/2013 | Do et al. ................. 257/676 |
| 2013/0277829 A1 | 10/2013 | Yee et al. |
| 2014/0124919 A1* | 5/2014 | Huang et al. ............ 257/737 |
| 2014/0197548 A1 | 7/2014 | Do et al. |

* cited by examiner

# US 9,391,026 B2

SEMICONDUCTOR PACKAGES AND METHODS OF PACKAGING SEMICONDUCTOR DEVICES

CROSS-REFERENCE TO RELATED APPLICATION

This application is a divisional application of co-pending U.S. patent application Ser. No. 13/831,964 filed Mar. 15, 2013, the content of which is hereby incorporated by reference in its entirety for all purposes.

BACKGROUND

Leadframe-based packages, such as high density leadframe array (HLA) packages, are popular packaging solutions for high I/O devices in the industry. However, existing leadframe-based packages suffer from several disadvantages. For example, leadframe-based packages have limited capability in terms of trace routing density and the package level reliability is limited. There is also a need to increase the efficiency and reliability of the HLA packages for high frequency applications.

From the foregoing discussion, there is a desire to provide an improved package having very thin package profile, higher I/O counts, fine pitch trace routing which leads to improved signal routing density and with enhanced electrical performance. It is also desirable to provide simplified methods to form an improved package with relatively low cost.

SUMMARY

Embodiments relate generally to semiconductor packages. In one embodiment, a package substrate is disclosed. The package substrate includes a base substrate having first and second major surfaces and a plurality of via contacts extending through the first to the second major surfaces of the base substrate. A first conductive layer having a plurality of openings is disposed over the first surface of the base substrate and via contacts. The openings are configured to match conductive trace layout of the package substrate. Conductive traces are disposed over the first conductive layer. The conductive traces are directly coupled to the via contacts through some of the openings of the first conductive layer.

In another embodiment, a semiconductor package is presented. The semiconductor package includes a package substrate having first and second major surfaces. The package substrate includes a base substrate and a plurality of via contacts extending through the first to the second major surface of the package substrate. A first conductive layer having first and second type openings is disposed over the first surface of the package substrate. The openings are configured to match conductive trace layout of the package substrate. Conductive traces are disposed over the first conductive layer. The conductive traces are directly coupled to the via contacts through the first type openings of the first conductive layer. A die having conductive contacts on its first or second surfaces is disposed over a die region of the package substrate. The conductive contacts of the die are electrically coupled to the conductive traces. A cap disposed over the package substrate to encapsulate the die.

In yet another embodiment, a method for forming a semiconductor package is presented. The method includes providing a conductive carrier having first and second surfaces. A first conductive layer having first and second type openings is formed over the first surface of the conductive carrier. Conductive traces are formed over the first conductive layer. A die is mounted on the first surface of the conductive carrier. The die is coupled to the conductive traces. The die is encapsulated with a cap. The second surface of the conductive carrier is patterned to form via contacts of a package substrate. The conductive traces are directly coupled to the via contacts through the first type openings of the first conductive layer. An insulating layer filling spaces between the via contacts is formed to form a base substrate of the package substrate.

These embodiments, along with other advantages and features herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DESCRIPTION

Embodiments relate to semiconductor packages and methods for forming a semiconductor package. The packages are used to package one or more semiconductor dies or chips. For the case of more than one die, the dies may be arranged in a planar arrangement, vertical arrangement, or a combination thereof. The dies, for example, may include memory devices, logic devices such as mixed signal logic devices, communication devices, RF devices, optoelectronic devices, digital signal processors (DSPs), microcontrollers, system-on-chips (SOCs), micro-electro-mechanical systems (MEMS) as well as other types of devices or a combination thereof. Such packages may be incorporated into electronic products or equipment, such as phones, computers as well as mobile and mobile smart products. Incorporating the packages into other types of products may also be useful.

Figure 1:
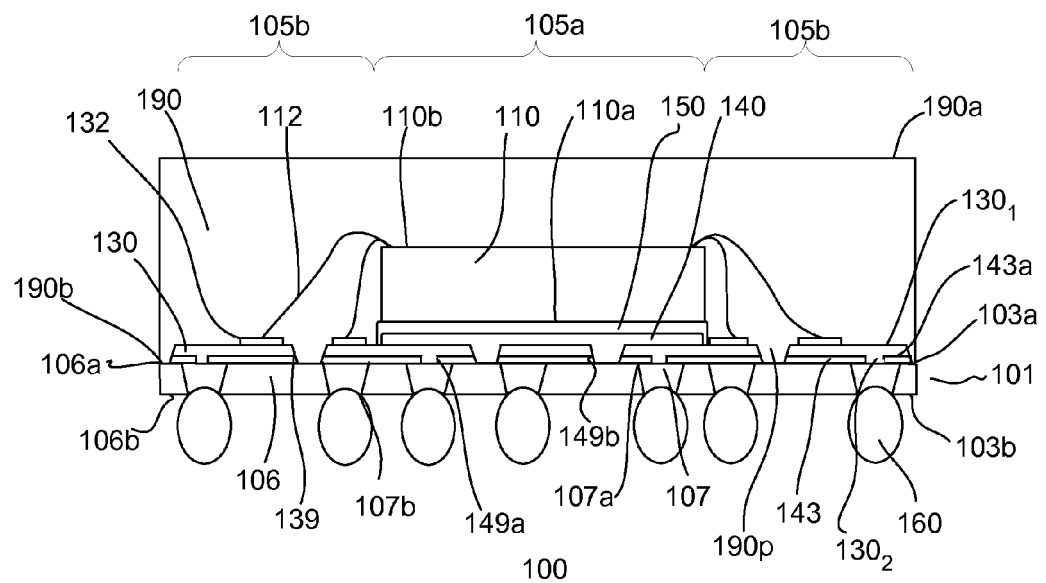
FIGS. 1-6 show various embodiments of a semiconductor package.

FIGS. 1-6 show simplified cross-sectional views of different embodiments of a semiconductor package. The semiconductor package 100, as shown in FIG. 1, includes a package substrate 101. The package substrate includes first and second major surfaces 103a-b. The first major surface 103a, for example, may be referred to as the top surface and the second major surface 103b, for example, may be referred to as the bottom surface. Other designations for the surfaces may also be useful. In one embodiment, the first major surface of the package substrate includes first and second regions. The first region 105a, for example, is a die or chip region on which a die 110 is mounted and the second region 105b, for example, is a non-die region. In one embodiment, the non-die region surrounds the die region. The die region, for example, may be disposed in a central portion of which the die is mounted and a non-die region which is outside of the die region. The die region, for example, may be concentrically disposed within the periphery of the package substrate. Other configurations of die and non-die regions may also be useful.

In one embodiment, the package substrate includes a base substrate 106 and a plurality of via contacts 107 extending from the first to the second major surface of the package substrate. In one embodiment, the base substrate includes a dielectric material, such as solder mask. The base substrate may be formed of other suitable types of substrate materials. The base substrate, for example, may be may include any suitable thickness, depending on manufacturing capabilities. The base substrate includes first and second major surfaces 106a-b, defining the first and second major surfaces of the package substrate.

The via contacts 107, in one embodiment, are formed of a single conductive material. The via contacts, for example, may be formed of a monolithic conductive material. For example, the via contacts may be formed of Cu, Cu alloy, Fe or Ni—Fe alloy. Other suitable types of conductive materials may also be useful. The via contacts may have tapered or straight profiles. The via contacts, for example, are held together and surrounded by the base substrate. The via contacts, as shown, are isolated from each other by the base substrate.

The via contacts include first and second surfaces 107a-b. The second surface 107b of the via contacts, in one embodiment, is substantially coplanar with the second surface 106b of the base substrate. In another embodiment, the second surface of the via contacts is non-coplanar with the second surface of the base substrate. For example, the second surface of the via contacts may be above or below the second surface of the base substrate. The second surface of the via contacts, as shown, is disposed below or recessed with respect to the second surface of the base substrate.

The package substrate, in one embodiment, further includes a first conductive layer 143 having a plurality of openings 149 being disposed over the first surface 103a of the package substrate. The first conductive layer, for example, is a patterned or predefined conductive layer having a plurality of openings which are configured to match the conductive trace layout of the package substrate. The plurality of openings is defined based on via contact regions and non-via contact regions of the package substrate. Via contact regions of the package substrate, for example, may be referred to areas where via contacts are formed while non-via contact regions may be referred to areas where no via contacts are formed. In one embodiment, first type openings 149a of the first conducive layer are formed in via contact regions and define locations under which via contacts are formed. Second type openings 149b of the first conductive layer, in one embodiment, are disposed in non-via contact regions and provides isolation pathway between conductive traces.

In one embodiment, the first conductive layer includes a different material than the via contacts. Any other suitable types of materials may be used for the first conductive layer so long as it provides etch selectivity between the first conductive layer and the via contacts or conductive traces which will be described later. For example, the first conductive layer includes nickel. Other suitable types of conductive materials, including suitable types of plating material, may also be useful. The first conductive layer may include any suitable thicknesses and conductive materials, depending on the desired electrical properties to suit the required applications.

In one embodiment, conductive traces 130 are disposed on the first surface 143a of the first conductive layer as shown in FIG. 1. As shown, the conductive traces include a first portion 130$_1$ over the first surface 143a of the first conductive layer 143 while a second portion 130$_2$ of the conductive traces occupies the first type openings 149a in the first conductive layer. The conductive traces 130, as shown, are directly and fully coupled to the via contacts 107 through the first type openings in the first conductive layer, forming interconnect structures of the package substrate. The first type openings 149a in the first conductive layer 143 provide a conductive pathway between the conductive traces and via contacts.

The conductive traces, in one embodiment, are formed of the same conductive material as the via contacts, such as copper. In another embodiment, the conductive traces may be formed of a different material than the via contacts. Other suitable types of conductive material, including suitable types of plating material, may also be useful. The thickness of the conductive traces, for example, may be as low as about 10 µm.

The package substrate further includes contact/bond pads 132 which are disposed over contact/bond pad regions of the conductive traces. The contact pads, in one embodiment, include a single metal layer, such as Cu, Al, Ag, or Au. In another embodiment, the contact pads may include a multi-layered stack. The multi-layered stack may include Ni/Pd/Au to form, for example, a wire bondable surface; or Cu, Cu alloy or Cu/Sn to form, for example, a solder wettable surface for flip chip application. Other suitable types of conductive materials may also be useful. The contact pads, for example, include the same material as the via contacts and conductive traces. For example, the contact pads include copper. The contact pads, for example, may include any suitable thicknesses.

The package substrate may optionally include an insulating layer 140, covering and filling the spaces 139 between the conductive traces in the die region 105a of the package substrate as shown in FIG. 1. The insulating layer, for example, isolates the conductive traces in the die region. Moreover, the insulating layer may also electrically isolate the conductive traces from a second surface of the die. In one embodiment, the insulating layer includes a dielectric material. The dielectric material, for example, includes solder mask, organic dielectric material such as polyimide, benzocyclobutene, etc., or inorganic dielectric material such as $SiO_2$, AlN, $Al_2O_3$, etc. Other suitable types of dielectric materials may also be useful.

In one embodiment, an adhesive layer 150 may be used to mount a die 110 to the package substrate. The die 110 can be a semiconductor die or chip. The die includes first and second major surfaces. The first surface 110a, for example, is an inactive surface of the die and the second surface 110b is an active surface of the die. Other designations for the surfaces of the die may also be useful. The active surface, for example, includes openings (not shown) in a final passivation layer to expose conductive die pads/contacts (not shown). The surfaces of the die pads, for example, are substantially coplanar with the second surface of the die. Providing surfaces of the conductive pads which are not coplanar with the second major surface of the die may also be useful. The die pads provide connections to the circuitry of the die. The die pads, for example, are formed of a conductive material, such as copper, aluminum, gold, nickel or alloys thereof. Other types of conductive material may also be used for the die pads. The pattern of the die pads may be one or more rows disposed at the periphery of the active surface. Other pad patterns may also be useful.

The inactive surface of the die is mounted to the die region of the package substrate with the use of the adhesive layer. The adhesive layer 150, for example, may include an adhesive paste or die attach film, such as tape. Other types of adhesive, such as epoxy, may also be useful. In one embodiment, wire bonds 112 are provided to couple the die pads on the die to the conductive traces 130. The wire bonds create electrical connection between the conductive traces of the package substrate and die pads on the die.

In one embodiment, a cap 190 is disposed on top of the package substrate, encapsulating the die and the wire bonds. The cap serves to protect the die from the environment. For example, the cap may protect the die from moisture. The cap, for example, is formed of an encapsulation material. The encapsulation material, for example, may include molding epoxy resin material. Other suitable types of encapsulation materials may also be useful.

The cap includes first and second major surfaces 190a-b. The first surface 190a, for example, may be the top surface and the second surface 190b may be the bottom surface. Other designations for the surfaces of the cap may also be useful. In one embodiment, the cap surrounds and covers the die and the wire bonds. The second surface 190b of the cap, in one embodiment, includes a non-planar surface. For example, portions of the second surface of the cap include protruded portions 190p which occupy the second type openings 149b of the first conductive layer and spaces 139 between the conductive traces. The protruded portions of the cap, in one embodiment, isolate the conductive traces. The surface of the protruded portions of the cap, in one embodiment, contact portions of the first surface 106a of the base substrate. The protruded portions of the cap isolate the conductive traces in the non-die region of the package substrate while the dielectric material of the optional insulating layer isolates the conductive traces in the die region of the package substrate.

Package contacts 160 are disposed on the second surface 107b of the via contacts. The package contacts, for example, are spherical shaped structures or balls. The package contacts protrude from the second surface 103b of the package substrate. Providing package contacts which do not protrude from the bottom surface of the package substrate, such as solder lands, may also be useful. The package contact is formed of a conductive material. The package contacts, for example, can be formed from solder. Various types of solder can be used to form the package contacts. For example, the solder can be a lead-based or non lead-based solder. Other types of conductive materials may also be used to form the package contacts.

The package contacts provide external access to the die via the conductive traces, via contacts and die pads. The package may be electrically coupled to an external device (not shown), such as a circuit board, by the package contacts.

Figure 2:
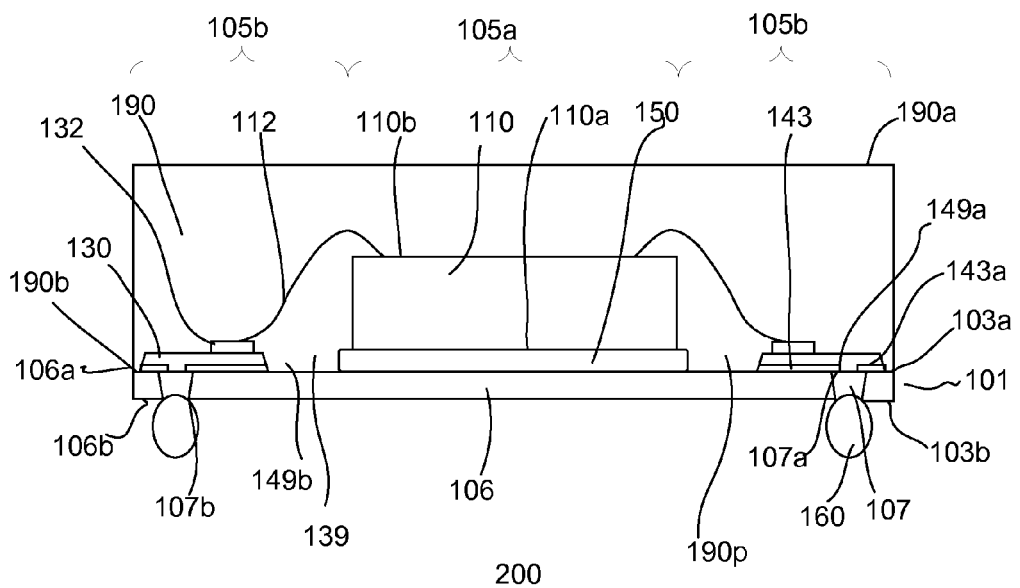

The package substrate, as described for example in FIG. 1, includes via contacts in the die and non-die regions. As such, the package substrate serves as fan-in and fan-out redistribution structure for the die contacts, enabling redistributed external package connections. In another embodiment, the package substrate may be modified. For example, via contacts may be provided only in the non-die regions, as shown in FIG. 2. As such, the package substrate serves as fan-out redistribution structure for the die contacts.

The semiconductor packages 100-200, as shown in FIGS. 1 and 2, include a wire bonded die. In another embodiment, the semiconductor packages may include a flip chip type of die (not shown). It is understood that modifications may be made to form contact pads which matches the die contacts of the flip chip for flip chip applications. It is also understood that for flip chip application, first surface of the cap may be covering the inactive surface of the flip chip or substantially coplanar with the inactive surface of the flip chip. As such, details for flip chip application may not be described or described in detail.

As described in the embodiments of FIGS. 1-2, the package substrate includes a patterned or predefined first conductive layer having a plurality of openings which are configured to match the conductive trace layout of the package substrate. The first type openings in the first conductive layer provide a conductive pathway between the conductive traces and via contacts. This allows direct coupling of the conductive traces to the via contacts which form the interconnect structures of the package substrate. Such configuration also ensures full connection within a signal interconnect structure, leading to enhanced electrical conductivity. Moreover, in embodiments where the conductive traces and via contacts include the same material, electrical resistance of the interconnect structure is reduced. This further improves electrical performance of the semiconductor package which allows packages to be employed more efficiently in, for example, high frequency applications.

Furthermore, as described in embodiments of FIGS. 1-2, the package substrate includes a plurality of via contacts held together and surrounded by the base substrate. As such, the via contacts will not be detached easily. This allows for improved robustness and reliability, relative to other types of packages. Furthermore, the second surface of the via contacts, in one embodiment, is disposed below or recessed with respect to the second surface of the base substrate. Such configuration is advantageous as it provides recesses or pockets for better receiving of package contacts. Additionally, the package substrate, as described for example in FIG. 1, includes via contacts in the die and non-die regions. As such, the package substrate serves as fan-in and fan-out redistribution structure for the die contacts, enabling redistributed external package connections. This leads to an increased number of I/O to be available in a given package area. The package substrate as described involves relatively low manufacturing cost and may potentially be used to replace BGA substrate. In addition, the package substrate includes package contacts and via contacts. The combination of the package contacts and the via contacts as described may improve the package board level reliability performance due to improved stand-off height. The semiconductor package may also be modified for flip chip applications. In embodiments where the first surface of the cap is substantially coplanar with the inactive surface of the flip chip, the inactive surface of the flip chip is exposed for dissipating heat. Such package has improved thermal performance. Additionally, such configuration also allows for inclusion of additional heat sink or heat spreader to further enhance heat dissipation.

Figure 3:
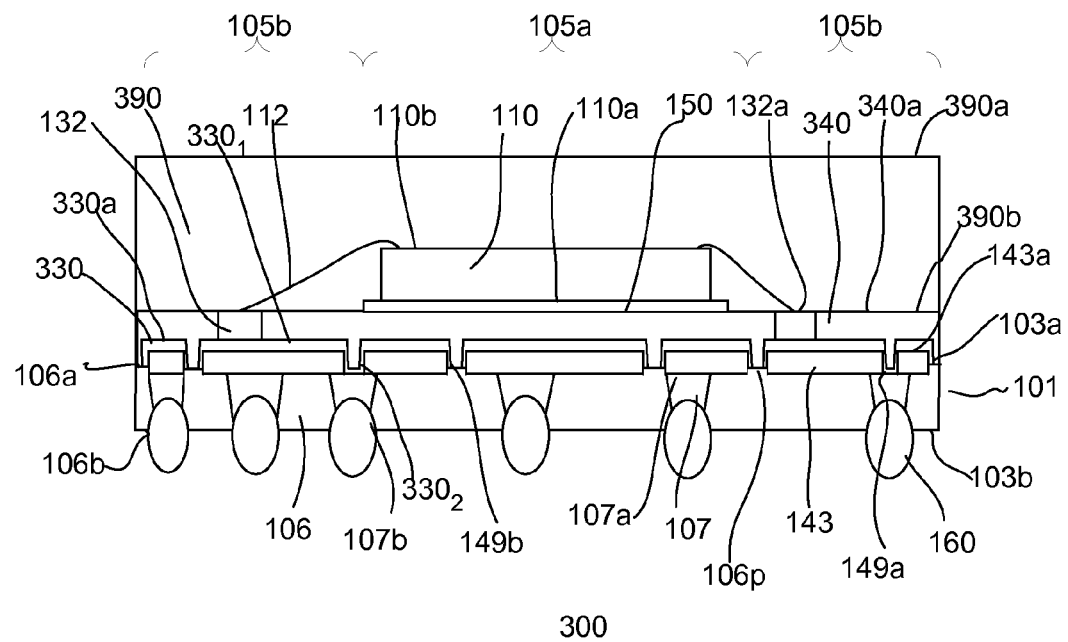

FIGS. 3-6 show various other embodiments of a semiconductor package. The semiconductor package 300 of FIG. 3 is similar to that described in FIG. 1. For example, the package substrate 101 includes a plurality of via contacts 107 held together and surrounded by the base substrate 106. A first conductive layer 143 having predefined openings 149a-b is disposed on the first surface of the package substrate and package contacts 160 are disposed on the second surface 107b of the via contacts, similar to that described in FIG. 1. As such, common elements may not be described or described in detail.

The base substrate 106, in one embodiment, differs from the base substrate of FIG. 1 in that the first surface 106a of the base substrate includes a non-planar surface. As shown in FIG. 3, portions of the first surface 106a of the base substrate is substantially coplanar with the first surface 107a of the via contacts while portions of the first surface of the base substrate include protruded portions 106p which partially occupy the second type openings 149b of the first conductive layer.

The package substrate, as shown in FIG. 3, includes conductive traces 330. In one embodiment, the first portion $330_1$ of the conductive traces is disposed over the first surface 143*a* of the first conductive layer while the second portion $330_2$ of the conductive traces line the sides and bottom of the first type openings 149*a* of the first conductive layer, forming recessed portion of the conductive traces. The conductive traces 330, in one embodiment, are directly coupled to the via contacts 107 through the recessed portions $330_2$ of the conductive traces in the first type openings 149*a* of the first conductive layer, forming interconnect structures of the package substrate. The first type openings 149*a* provide a conductive pathway between the conductive traces and via contacts.

The package substrate, in one embodiment, includes a dielectric layer 340 disposed over the conductive traces in the die and non-die regions of the package substrate. In one embodiment, the dielectric layer includes a solder mask, organic dielectric material such as polyimide, benzocyclobutene, etc., or inorganic dielectric material such as $SiO_2$, AlN, $Al_2O_3$, etc. Other suitable types of dielectric material may also be useful. The dielectric layer covers sides/edges and first surface 330*a* of the conductive traces and fill the spaces 139 between the conductive traces. In one embodiment, the dielectric layer isolates the bond pads 132 and the conductive traces 330 in the die and non-die regions of the package substrate. The dielectric layer, in one embodiment, includes a planar first surface 340*a* as shown in FIG. 3. The planar first surface of the dielectric layer, in one embodiment, is substantially coplanar with the first surface 132*a* of the bond pads. Providing a planar first surface of the dielectric layer which is non-coplanar with the first surface of the bond pads may also be useful.

A die 110 is mounted to the package substrate by an adhesive layer 150, similar to that described in FIG. 1. In one embodiment, the adhesive is disposed in the die region of the package substrate over the planar first surface of the dielectric layer. Wire bonds 112, for example, are provided to couple the die pads on the die to the bond pads. The bond pads are coupled to the conductive traces at the non-die region of the package substrate which are coupled to the via contacts as shown in FIG. 3. As such, features of the die will not be described or described in detail.

In one embodiment, a cap 390 having first and second surfaces 390*a-b* is formed over the dielectric layer, encapsulating the die and the wire bonds. In one embodiment, the cap surrounds and covers the die and the wire bonds. The second surface of the cap 390*b*, in one embodiment, includes a planar surface and contacts the first surface 340*a* of the dielectric layer. As shown in FIG. 3, the second surface of the cap is separated from the base substrate of the package substrate by the dielectric layer.

Figure 4:
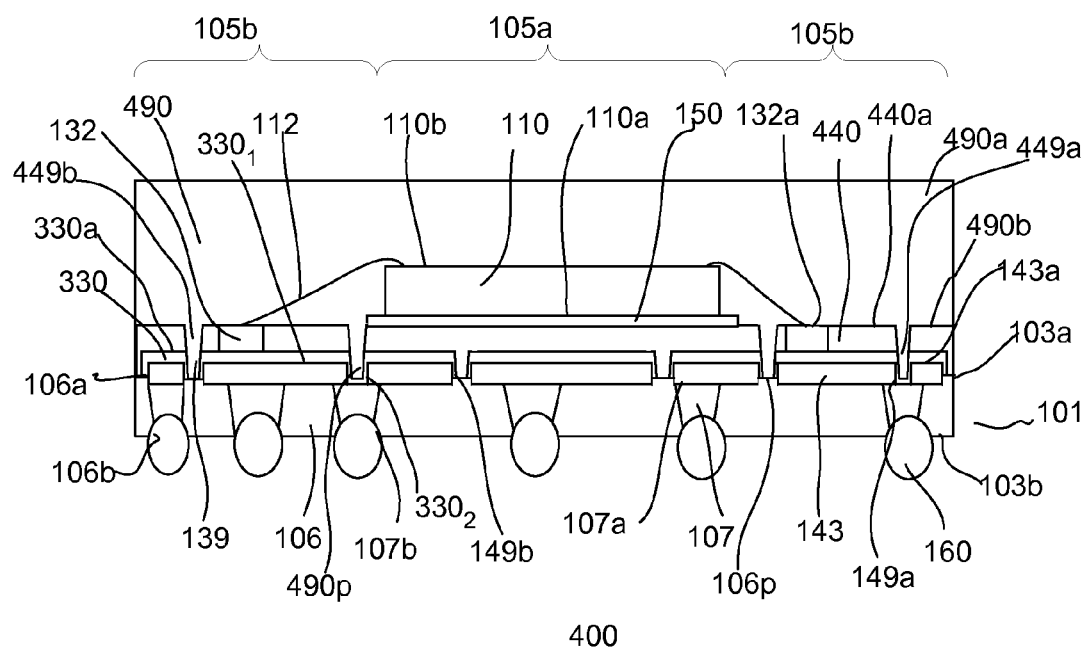

FIG. 4 shows another embodiment of a semiconductor package 400. The semiconductor package of FIG. 4 is similar to that described in FIGS. 1 and 3. For example, the package substrate includes a plurality of via contacts 107 held together and surrounded by the base substrate 106. The base substrate includes a non-planar first surface, the same as that described in FIG. 3. A first conductive layer 143 having predefined openings 149*a-b* is disposed on the first surface of the package substrate and package contacts 160 are disposed on the second surface 107*b* of the via contacts, similar to that described in FIG. 1. The first portion $330_1$ of the conductive traces is disposed over the first surface 330*a* of the first conductive layer while the second portion $330_2$ of the conductive traces line the sides and bottom of the first type openings of the first conductive layer, forming recessed portion of the conductive traces. As such, common elements may not be described or described in detail.

The package substrate, in one embodiment, includes a dielectric layer 440 disposed over the conductive traces in the die and non-die regions of the package substrate. The dielectric layer 440, in one embodiment, differs from the dielectric layer 340 of the package substrate of FIG. 3 in that the dielectric layer 440 includes first and second type openings 449*a-b*. The openings of the dielectric layer may be defined based on via contact regions and non-via contact regions of the package substrate. In one embodiment, first type openings 449*a* of the dielectric layer in the via contact regions expose the recessed portions $330_2$ of the conductive traces which are coupled to the via contacts while the second type openings 449*b* in the non-via contact regions expose surfaces of the protruded portions 106*p* of the base substrate.

A die 110 is mounted to the package substrate by an adhesive layer 150 which is disposed in the die region of the package substrate, similar to that described in FIG. 3. As such, features of the die and the electrical connection of the die will not be described or described in detail.

In one embodiment, a cap 490 having first and second surfaces 490*a-b* is formed over the dielectric layer 440, encapsulating the die 110 and the wire bonds 112. In one embodiment, the cap surrounds and covers the die and the wire bonds. The second surface of the cap 490*b*, in one embodiment, includes a non-planar surface. As shown in FIG. 4, portions of the second surface 490*b* of the cap include protruded portions 490*p* which occupy the openings 449*a-b* of the dielectric layer. The protruded portions of the cap, in one embodiment, isolate the conductive traces. The surface of the protruded portions of the cap, in one embodiment, contact the protruded portions 160*p* of the base substrate in the non-via contact regions while contact the recessed portions $330_2$ of the conductive traces in the via contact regions. The cap material and the protruded portions of the base substrate 106*p* isolate the conductive traces 330 in the non-die region 105*b* of the package substrate while the dielectric material of the dielectric layer 440 and the protruded portions of the base substrate 106*p* isolate the conductive traces in the die region 105*a* of the package substrate.

Figure 5:
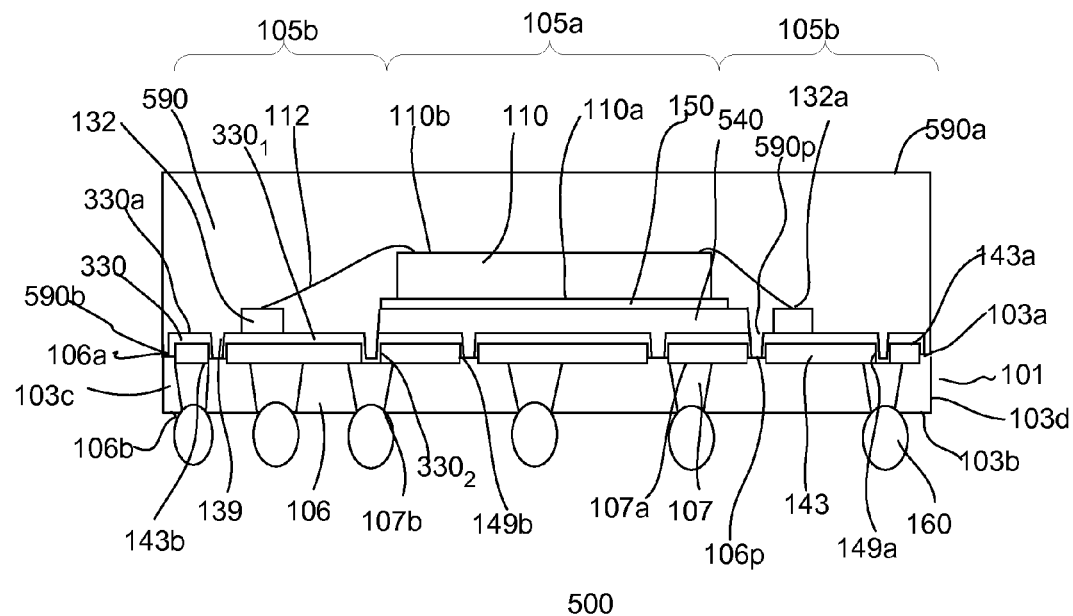

FIG. 5 shows another embodiment of a semiconductor package 500. The semiconductor package of FIG. 5 is similar to that described in FIGS. 1, 3 and 4. For example, the package substrate includes a plurality of via contacts 107 held together and surrounded by the base substrate 106. The base substrate includes a non-planar first surface, the same as that described in FIGS. 3 and 4. A first conductive layer 143 having predefined openings 149*a-b* is disposed on the first surface of the package substrate and package contacts 160 are disposed on the second surface 107*b* of the via contacts, similar to that described in FIG. 1. The first portion $330_1$ of the conductive traces is disposed over the first surface 143*a* of the first conductive layer while the second portion $330_2$ of the conductive traces line the sides and bottom of the first type openings 149*a* of the first conductive layer, forming recessed portion of the conductive traces. As such, common elements may not be described or described in detail.

The package substrate, in one embodiment, includes a dielectric layer 540 disposed over the conductive traces 330. The dielectric layer 540, in one embodiment, differs from the dielectric layer 440 of package substrate of FIG. 4 in that the dielectric layer 540 is disposed in the die region 105*a* of the package substrate. The dielectric layer 540 in the die region, for example, provides a planar die attach surface to ensure co-planarity across the die surface after the die attachment process.

A die 110 is mounted to the package substrate by an adhesive layer 150 which is disposed in the die region of the package substrate, similar to that described in FIGS. 3 and 4. As such, features of the die and the electrical connection of the die will not be described or described in detail.

In one embodiment, a cap 590 having first and second surfaces 590a-b is formed over the package substrate, encapsulating the die 110 and the wire bonds 112. In one embodiment, the cap surrounds and covers the die and the wire bonds. The second surface of the cap 590b, in one embodiment, includes a non-planar surface. As shown in FIG. 5, the second surface of the cap includes protruded portions which occupy the openings separating the conductive traces. The surface of the protruded portions 590p of the cap, in one embodiment, contact the protruded portions 106p of the base substrate in the non-via contact regions including the peripheries 103c-d of the package substrate while contact the recessed portions $330_2$ of the conductive traces in the via contact regions. The cap material and the protruded portions of the base substrate 106p isolate the conductive traces 330 in the non-die region 105b of the package substrate while the dielectric material of the dielectric layer 540 and the protruded portions of the base substrate 106p isolate the conductive traces 330 in the die region of the package substrate.

Figure 6:
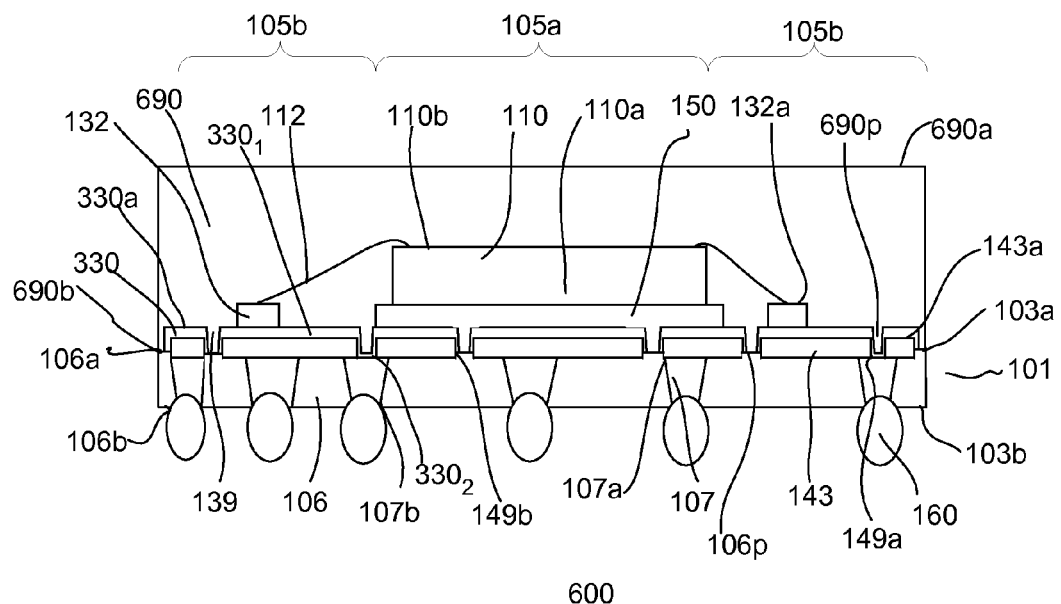

FIG. 6 shows another embodiment of a semiconductor package 600. The semiconductor package of FIG. 6 is similar to that described in FIGS. 1, 3, 4 and 5. For example, the package substrate includes a plurality of via contacts 107 held together and surrounded by the base substrate 106. The base substrate 106 includes a non-planar first surface, the same as that described in FIGS. 3, 4 and 5. A first conductive layer 143 having predefined openings 149a-b is disposed on the first surface of the package substrate and package contacts 160 are disposed on the second surface 107b of the via contacts, similar to that described in FIG. 1. The first portion $330_1$ of the conductive traces is disposed over the first surface 143a of the first conductive layer while the second portion $330_2$ of the conductive traces line the sides and bottom of the first type openings of the first conductive layer in the via contacts regions, forming recessed portion of the conductive traces. As such, common elements may not be described or described in detail.

The package substrate, in one embodiment, differs from the package substrate of FIG. 5 in that the no dielectric layer is disposed over the conductive traces.

A die 110 is mounted to the package substrate by an adhesive layer 150 which is disposed in the die region of the package substrate, similar to that described in FIGS. 3 and 4. As such, features of the die and the electrical connection of the die will not be described or described in detail.

In one embodiment, a cap 690 having first and second surfaces 690a-b is formed over the conductive traces 330, encapsulating the die 110 and the wire bonds 112. In one embodiment, the cap surrounds and covers the die and the wire bonds. The second surface of the cap 690b, in one embodiment, includes a non-planar surface. As shown in FIG. 6, the second surface of the cap includes protruded portions 690p which occupy the spaces 139 separating the conductive traces. The surface of the protruded portions 690p of the cap, in one embodiment, contact the protruded portions 106p of the base substrate in the non-via contact regions including the peripheries 103c-d of the package substrate while contact the recessed portions $330_2$ of the conductive traces in the via contact regions. The cap material and the protruded portions of the base substrate 106p isolate the conductive traces in the die and non-die regions 105a-b of the package substrate.

The semiconductor packages, as shown in FIGS. 3-6, include a wire bonded die. In another embodiment, the semiconductor packages may include a flip chip type of die (not shown). It is understood that modifications may be made to form contact pads which matches the die contacts of the flip chip for flip chip applications. It is also understood that for flip chip application, first surface of the cap may be covering the inactive surface of the flip chip or substantially coplanar with the inactive surface of the flip chip. As such, details for flip chip application may not be described or described in detail.

The embodiments described with respect to FIGS. 3-6 include some or all advantages as described with respect to FIGS. 1-2. As such, these advantages will not be described or described in detail. Moreover, as described in the embodiments of FIGS. 3-6, portions of the first surface of the base substrate include protruded portions 106p which partially occupy the second type openings 149b of the first conductive layer. As such, the second type openings 149b in the first conductive layer in the non-via contact regions of the package substrate provide more surface area for the base substrate to effectively hold the via contacts. As such, the reliability of the semiconductor package is further enhanced.

The embodiments, as described in FIGS. 1-6, show a semiconductor package having a wire bonded type of die. It is understood that other suitable types of dies, such as flip chip or TSV type of dies, may also be useful. The semiconductor packages, as illustrated in FIGS. 1-6, include a single die. It is understood that the semiconductor package, may also include a die stack (not shown). The die stack includes x number of dies, where x is ≥2. In addition, it is understood that the dies of the die stack may be the same size or type. Providing a die stack having chips which are different types and/or sizes is also useful.

Figure 7A:
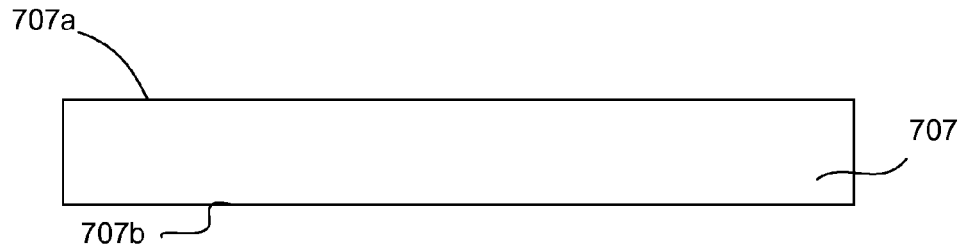
FIGS. 7a-l, FIGS. 8a-j, FIGS. 9a-f, FIGS. 10a-f, FIGS. 11a-f, FIGS. 12a-e and FIGS. 13a-d show various embodiments of a method for forming a semiconductor package.

FIGS. 7a-l show an embodiment of a method for forming a semiconductor package. Referring to FIG. 7a, a base carrier 707 or a leadframe is provided. The base carrier, in one embodiment, includes a conductive carrier having first and second major surfaces 707a-b. The first and second major surfaces, for example, include planar surfaces. Providing any one of the major surfaces to be non-planar may also be useful. The conductive carrier, for example, includes Cu, Cu alloy, Fe or Ni—Fe alloy. Other suitable types of conductive materials may also be useful. The thickness of the conductive carrier, for example, is about 100-300 µm. Other suitable thicknesses may also be useful. The conductive carrier, for example, may serve as part of the interconnect structures, such as via contacts, of the package substrate as will be described later.

Figure 7B:
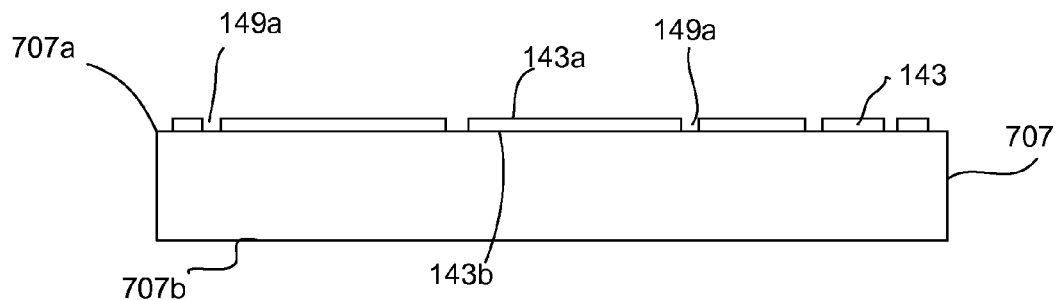

Referring to FIG. 7b, a first conductive layer 143 having a plurality of first type openings 149a is formed over the first surface of the conductive carrier 707a. The first conductive layer 143, for example, is a patterned or predefined conductive layer having a plurality of openings which are configured to match the conductive trace layout of the package substrate. The plurality of openings is defined based on via contact regions and non-via contact regions of the package substrate. Via contact regions of the package substrate, for example, may be referred to areas where via contacts are formed while non-via contact regions may be referred to areas where no via contacts are formed. In one embodiment, first type openings 149a of the first conducive layer are formed in via contact regions and define locations under which via contacts are formed.

In one embodiment, the first conductive layer 143 having predefined openings is formed by plating. For example, electrochemical or electroless plating may be employed to form the first conductive layer. For example, a patterned mask layer (not shown) may be provided over the first surface 707a of the conductive carrier. A plating process is performed. The first conductive layer may be selectively plated over the exposed portions of the first surface of the conductive carrier not covered by the patterned mask layer. The conductive carrier thus also serves as a base or substrate for the electroplating process for forming the first conductive layer. Other suitable types of techniques may also be employed to form the first conductive layer.

The first conductive layer, in one embodiment, includes a different material than the material of the conductive carrier. Any other suitable types of materials may be used for the first conductive layer so long as it provides etch selectivity between the first conductive layer and the via contacts or conductive traces which will be described later. For example, the first conductive layer includes nickel. Other suitable types of conductive materials, including suitable types of plating material, may also be useful. The first conductive layer may include any suitable thicknesses and conductive materials, depending on the desired electrical properties to suit the required applications. The process continues to remove the patterned mask layer, thus forming the first conductive layer having first type openings 149a as shown in FIG. 7b. As shown, the openings 149a expose portions of the first surface of the conductive carrier.

Figure 7C:
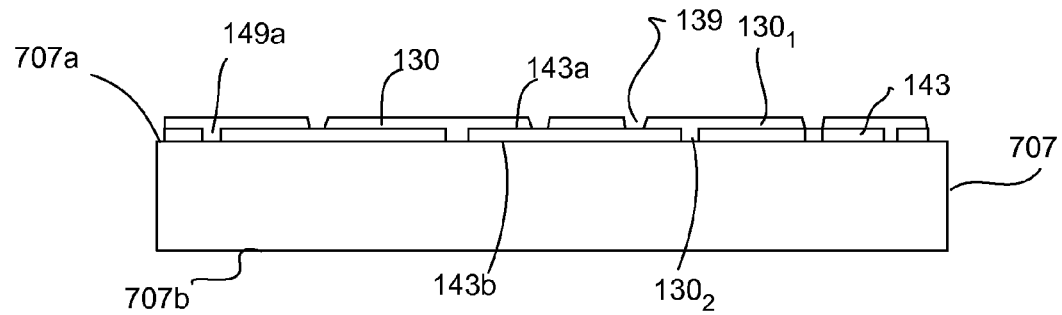

The process continues to form conductive traces of the package substrate as shown in FIG. 7c. For example, electrochemical or electroless plating may be employed to form the conductive traces. In one embodiment, a patterned mask layer (not shown) may be provided over the conductive carrier. A plating process is performed. In one embodiment, a second conductive layer, which includes the same material as the conductive carrier 707, such as copper, may be selectively plated over the exposed portions of the first surface of the first conductive layer not covered by the patterned mask layer to form conductive traces 130. The first conductive layer 143 thus also serves as a base or substrate for the electroplating process for forming the conductive traces. Other suitable techniques may also be used to form the conductive traces. The thickness of the plated conductive traces 130, for example, is about 50-150 µm. The thickness of the plated conductive traces, for example, may also be as low as about 10 µm. Other suitable thicknesses may also be useful. As shown, the plated conductive traces include a first portion $130_1$ over the first surface 143a of the first conductive layer while a second portion $130_2$ of the conductive traces fill the first type openings 149a in the first conductive layer. The process continues to remove the patterned mask layer, thus forming the conductive traces having predefined openings/spaces 139 separating the conductive traces as shown in FIG. 7c.

Figure 7D:
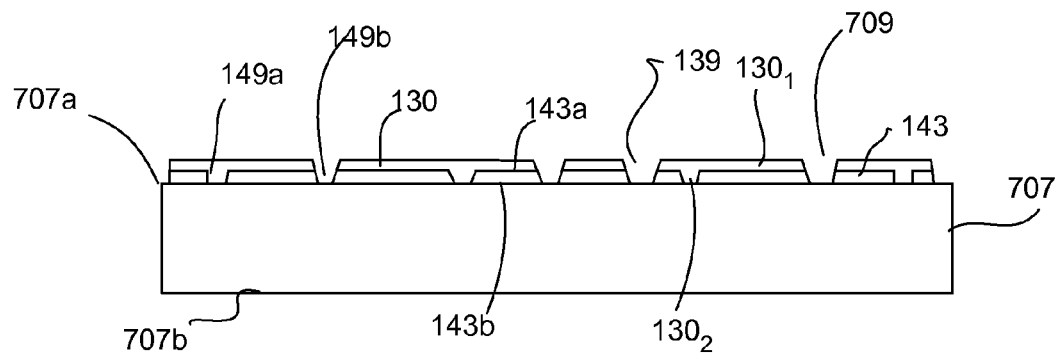
Figure 7E:
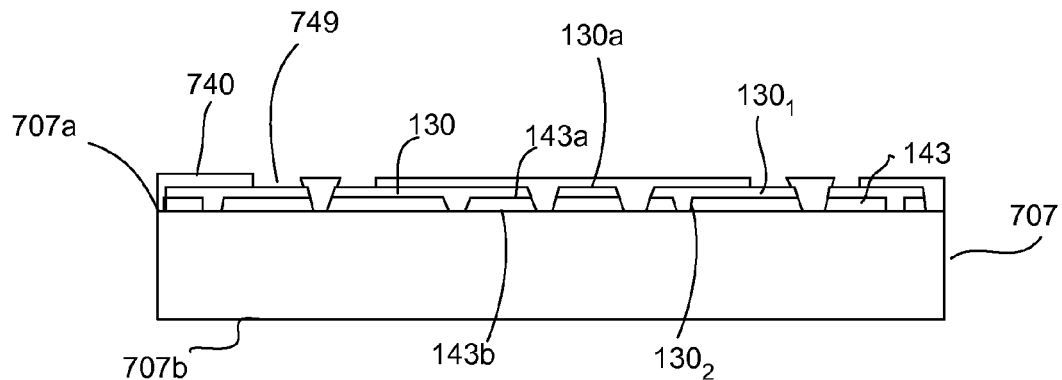

The process continues by removing portions of the first conductive layer to form second type openings 149b in the first conductive layer. Second type openings 149b of the first conductive layer, in one embodiment, are formed in non-via contact regions. In one embodiment, portions of the first conductive layer may be removed by a patterning process. Patterning of the first conductive layer can be achieved by any suitable etching techniques. The patterning of the first conductive layer may be performed without a need of a patterned mask. In one embodiment, portions of the first conductive layer may be removed using the conductive traces as the etch mask. An etch may be performed using the conductive traces to remove portions of the first conductive layer. As shown in FIG. 7d, portions of the first conductive layer exposed by the spaces 139 between the conductive traces 130 are removed to create the second type openings 149b in the first conductive layer. As such, portions of the first surface 707a of the conductive carrier in the openings are exposed. The etch, for example, may be a wet etch. Other suitable techniques may also be employed to remove portions of the first conductive layer. The openings 709, as shown, extend from the first surface of the conductive traces to the second surface of the first conductive layer. The openings, for example, may have tapered or straight profiles. A partially processed package substrate is thus formed as shown in FIG. 7d.

The process continues by forming contact/bond pads over, for example, portions of the conductive traces. In one embodiment, a dielectric layer 740 having predefined openings 749 is provided over the conductive traces 130. The dielectric layer, in one embodiment, includes a solder mask. The solder mask, in one embodiment, is predefined with a plurality of openings which define areas over the conductive traces where bond pads are to be formed while the solder mask covers the non-bond pad regions of the conductive traces. For example, the solder mask fill the openings 709 and covers edges of the conductive traces and the first conductive layer as well as portions of the first surface 130a of the conductive traces which are to be kept free of bond pads. The openings 709, for example, may be formed by exposure and development techniques. Other suitable techniques may also be used to form the openings 709. In another embodiment, the bond pads may be formed over the entire conductive traces.

Figure 7F:
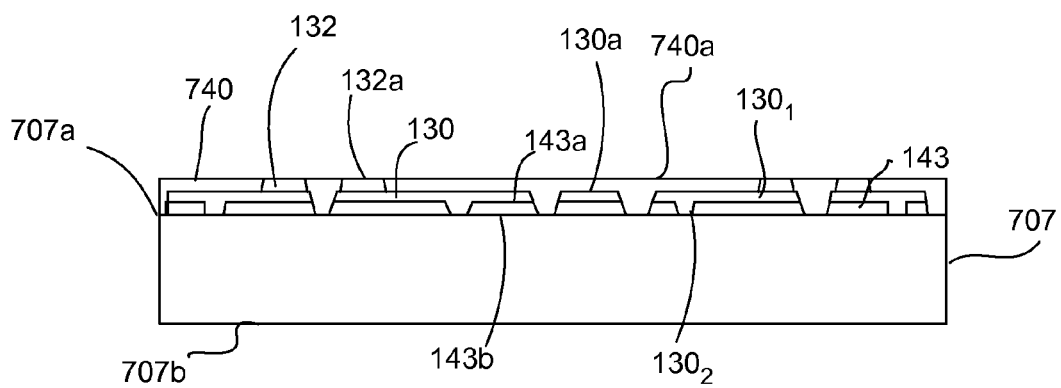

Referring to FIG. 7f, contact/bond pads 132 are formed in the openings 749 of the dielectric layer. In one embodiment, the bond pads are formed by a plating process. A conductive layer, which may include the same material as the conductive carrier and traces, such as copper, may be selectively plated over the exposed portions of the first surface 130a of the conductive traces not covered by the dielectric layer to form the bond pads. As such, the dielectric layer also serves as a plating mask. The first surface 130a of the conductive traces also serves as a base or substrate for the electroplating process for forming the bond pads. Other suitable types of conductive material, such as Al, Ag, or Au may also be plated. In another embodiment, the contact pads may include a multi-layered stack. The multi-layered stack may include Ni/Pd/Au to form, for example, a wire bondable surface; or Cu, Cu alloy or Cu/Sn to form, for example, a solder wettable surface for flip chip application. Other suitable types of conductive materials may also be useful. The thickness of the plated bond pads, for example, is about 0.01-1.5 µm. Other suitable thicknesses may also be useful. The bond pads, for example, may include a first surface 132a which is substantially coplanar with first surface 740a of the dielectric layer. Providing first surface 132a of the bond pads which is non-coplanar with the first surface of the dielectric layer may also be useful.

Figure 7G:
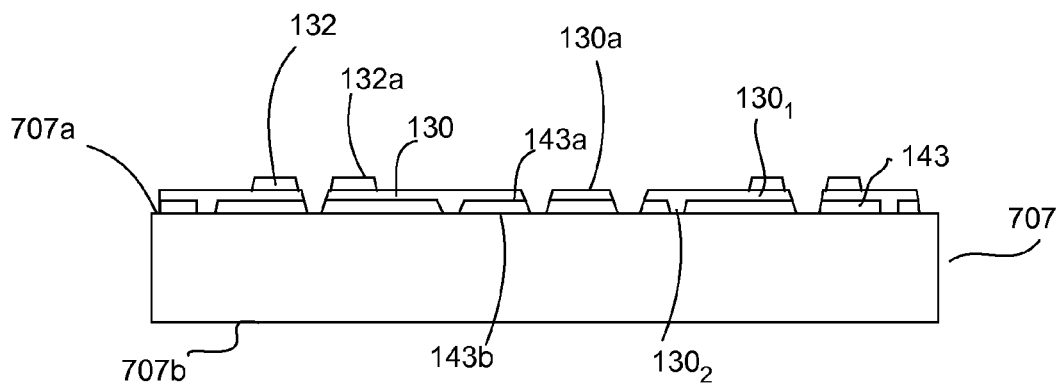

In one embodiment, the process continues to remove the dielectric layer 740, such as the solder mask, as shown in FIG. 7g. The dielectric layer 740, for example, may be removed by etching. Other suitable techniques may be employed to remove the dielectric layer. As shown, the dielectric layer is removed, leaving bond pads 132 over the bond pad regions of the conductive traces. In an alternative embodiment, the dielectric layer 740 need not be removed and serves as isolation layers between the conductive traces.

Figure 7H:
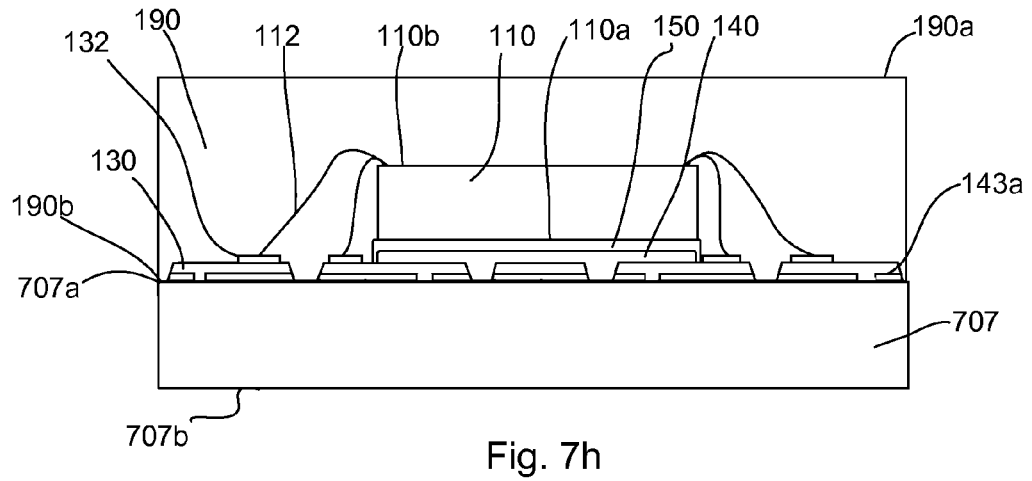

An insulating layer 140 may optionally be provided, covering and filling the spaces between the conductive traces in a die region 105a of the package substrate after removing the dielectric layer 740 as shown in FIG. 7h. The insulating layer 140 isolates the conductive traces 130 in the die region. In one embodiment, the insulating layer includes a dielectric material, such as solder mask, organic dielectric material such as polyimide, benzocyclobutene, etc., or inorganic dielectric material such as $SiO_2$, AlN, $Al_2O_3$, etc. The insulating layer, for example, may be formed by dispensing, laminating, screen printing, followed by exposure and development techniques. Other types of dielectric materials and techniques may also be used for forming the insulating layer.

Referring to FIG. 7h, a die 110 or a semiconductor chip which includes circuit components is attached to the die region 105a of the package substrate. The circuit components include, for example, transistors, resistors, capacitors and interconnections to form an IC. A final passivation layer (not shown) may be formed over the die. The final passivation layer includes openings (not shown) to expose die pads/contacts (not shown). The surface of the die which includes the openings to the die pads may be referred to as the active surface 110b of the die. In one embodiment, an adhesive layer 150 may be used to mount the die to the die region of the package substrate. For example, the inactive surface 110a of the die is mounted to the package substrate with the use of the adhesive layer. The adhesive layer, for example, may include an adhesive paste or die attach film, such as tape. Other types of adhesive, such as epoxy, may also be useful. In one embodiment, wire bonds 112 are formed to create electrical connection between the bond pads which are coupled to the conductive traces on the package substrate and die pads on the die.

A cap 190 is formed on the package substrate. For example, an encapsulation material is dispensed to encapsulate the die 110 and the wire bonds 112. In one embodiment, the encapsulation material includes a mold compound, such as molding epoxy resin material. Providing other types of encapsulation materials may also be useful. The cap includes first and second major surfaces 190a-b. In one embodiment, the encapsulation material fills the openings 709 between the conductive traces in the non-die region 105b and the second surface 109b of the cap contacts the first surface 707a of the conductive carrier.

The cap, in one embodiment, is formed by transfer molding techniques. Encapsulation material, such as a mold compound, is dispensed into the mold assembly to form the cap. After molding, the molded die is separated from the mold. Other suitable types of techniques for forming the cap may also be useful. For example, the cap may also be formed by printing or compression molding.

Figure 7I:
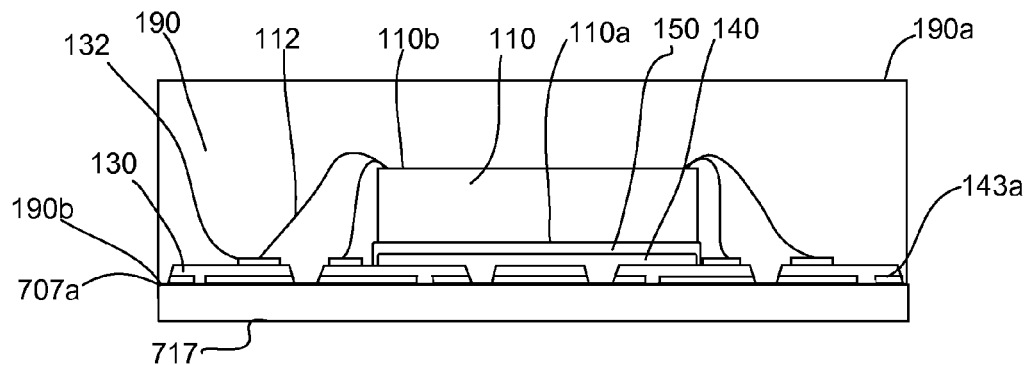

In FIG. 7i, the second surface 707b of the conductive carrier is processed. In one embodiment, portions of the conductive carrier 707 are removed. For example, the second surface of the conductive carrier is patterned to remove excess material. For example, the conductive carrier is thinned or removed up to a suitable thickness. The thickness of the conductive carrier after the removal process, for example, is about 5-10 μm. The conductive carrier may be thinned to a desired via contact thickness. The second major surface of the conductive carrier may be removed using etch, grinding or polishing technique. The etch, for example, includes wet etch/chemical etch. Other techniques for thinning the conductive carrier may also be useful.

Figure 7J:
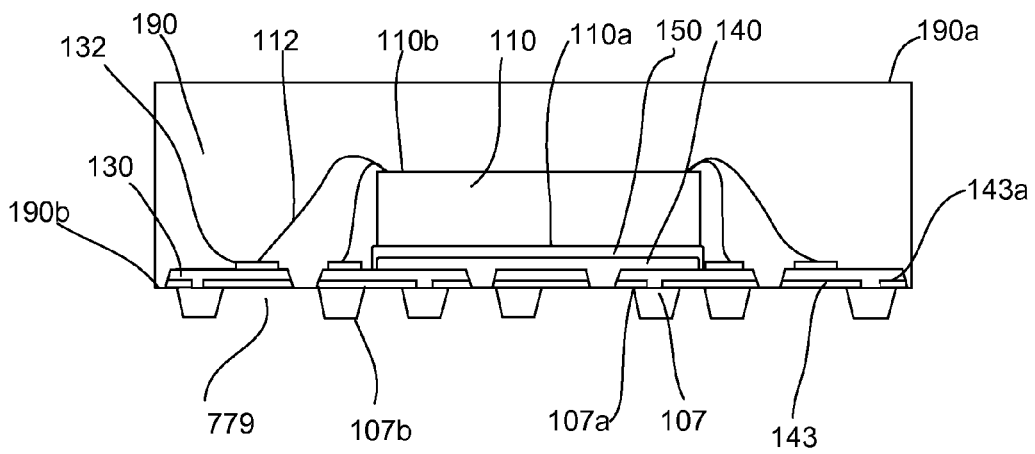

The process continues to form via contacts 107 of the package substrate as shown in FIG. 7j. In one embodiment, the via contacts 107 of the package substrate are formed by patterning the remaining conductive carrier. Patterning of the conductive carrier may be performed with the help of a patterned masked layer. Patterning of the conductive carrier can be achieved by any suitable etching techniques. For example, a patterned etch mask (not shown), such as photoresist, is provided over the second surface 717 of the thinned conductive carrier. An etch may be performed using the etch mask to remove portions of the conductive carrier unprotected by the etch mask. The etch, for example, may be an isotropic etch, such as a wet etch. Other techniques for patterning the conductive carrier may also be useful. The thickness of the via contacts as formed, for example, is substantially the same as the thickness of the thinned conductive carrier. The conductive vias, for example, may also include other suitable thicknesses. The via contacts 107 are coupled to the conductive traces 130. As shown, the first type openings 149a in the first conductive layer allows the via contacts 107 to be directly coupled to the conductive traces 130 to form interconnect structures of the package substrate. The first type openings 149a of the first conductive layer 143 in the via contact regions thus provide a conductive pathway between the conductive traces and via contacts while the second type openings 149b of the first conductive layer in the non-via contact regions provide isolation pathway between conductive traces.

After patterning the conductive carrier, the mask is removed. The mask, for example, may be removed by ashing. Other techniques for removing the mask may also be useful.

Figure 7K:
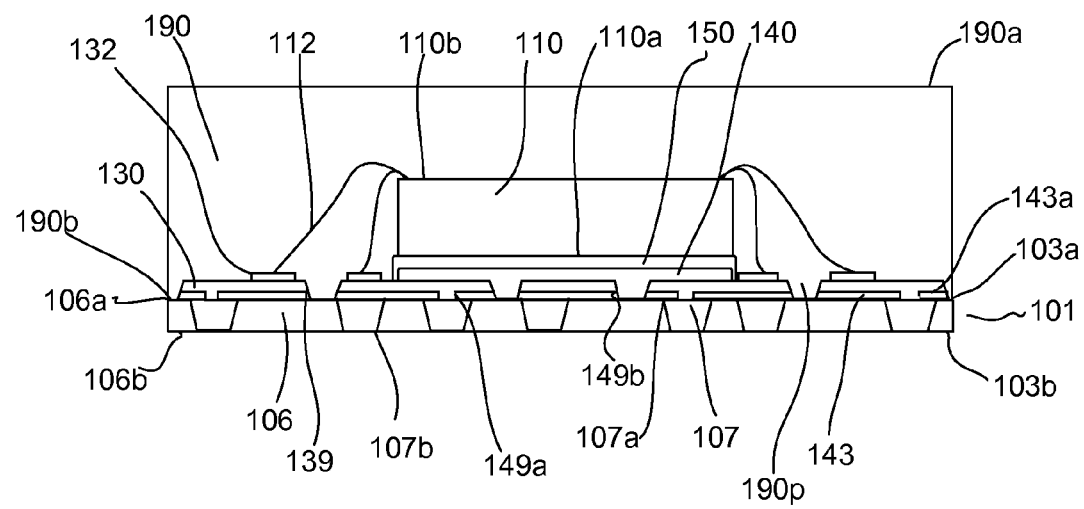

An insulating layer 106, in one embodiment, is provided, filling the spaces 779 between the via contacts as shown in FIG. 7k. The insulating layer isolates the via contacts. In one embodiment, the insulating layer includes a dielectric material such as solder mask. The insulating layer, for example, may be formed by any suitable types of dielectric materials and techniques. The insulating layer formed in between the via contacts may be referred to as the base substrate 106 of the package substrate.

The second surface of the via contacts 107b, in one embodiment, are substantially coplanar with the second surface 106b of the base substrate. In another embodiment, the second surface of the via contacts are non-coplanar with the second surface of the base substrate as shown in FIG. 7k. For example, the second surface of the via contacts may be above or below the second surface of the base substrate.

Figure 7L:
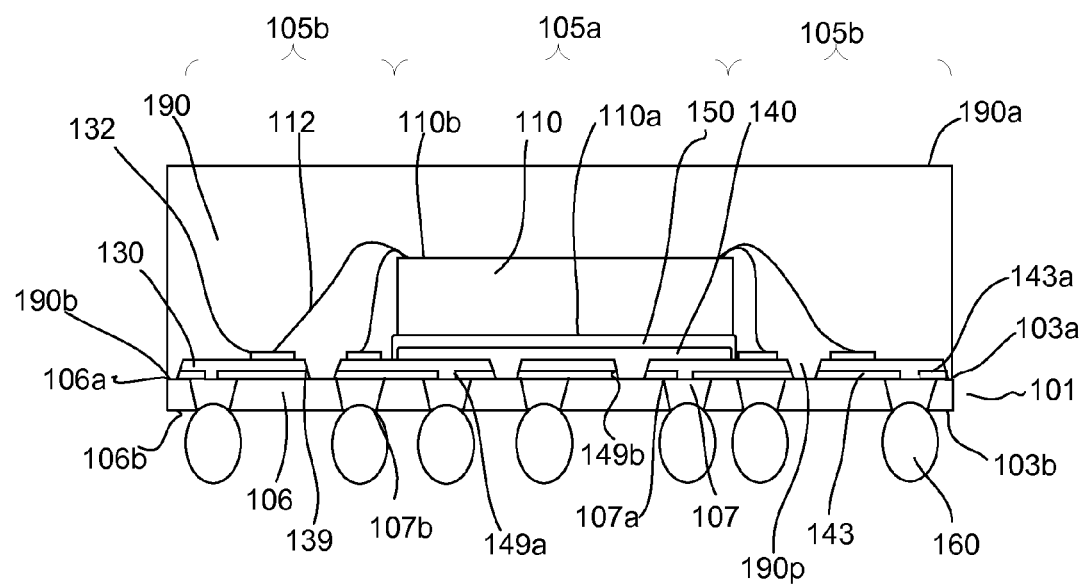

The process continues by forming package contacts 160 coupled to the via contacts, as shown in FIG. 7l. For example, the package contacts are formed on the second surface 107b of the via contacts. The package contacts, for example, may include spherical shaped structures or balls arranged in grid pattern to form a BGA type package. As such, a semiconductor package such as that shown in FIG. 1 is formed. The package contacts are formed of a conductive material. The package contacts, for example, can be formed from solder. Various types of solder can be used to form the package contacts. For example, the solder can be a lead-based or non lead-based solder.

In some embodiments, other types of package contacts are coupled to the via contacts. For example, the package contacts may include contacts which do not protrude from the bottom surface of the package substrate. Providing package contacts which do not protrude from the bottom surface of the package substrate, such as solder lands, may also be useful. The package contacts may be formed of materials other than solder, such as anisotropic conductive film (ACF), or using other techniques.

The process as described with respect to FIGS. 7a-l is suitable for wire bonded type of die or chip packages. The process may also be useful for other types of dies, including flip chip type of dies. It is understood that modifications may be made to form conductive pads which matches the pattern of die contacts of a flip chip (not shown). It is also understood that for flip chip application, first surface of the cap may be covering the inactive surface of the flip chip or substantially coplanar with the inactive surface of the flip chip. As such, details for flip chip application may not be described or described in detail.

The processes, as described with respect to FIGS. 7a-l, result in advantages. As described in FIGS. 7a-l, the package substrate includes a patterned or predefined first conductive layer having a plurality of openings which are configured to match the conductive trace layout of the package substrate. The first type openings in the first conductive layer provide a conductive pathway between the conductive traces and via contacts. This allows direct coupling of the conductive traces to the via contacts which form the interconnect structures of the package substrate. Such configuration also ensure full connection within a signal interconnect structure, leading to enhanced electrical conductivity. Moreover, in embodiments where the conductive traces and via contacts include the same material, electrical resistance of the interconnect structure is reduced. This further improves electrical performance of the semiconductor package which allows packages to be employed more efficiently in, for example, high frequency applications.

In addition, the first conductive layer, in one embodiment, is plated onto the conductive carrier for better handling. For example, the first conductive layer, such as nickel, acts as a barrier or etch stop layer during the removal of portions of the conductive carrier to form via contacts. As such, the conductive traces at the non-via contact regions will not be overetched during the removal of portions of the conductive carrier.

As described, the conductive traces, in one embodiment, are formed by plating. This allows better control of the thickness of the conductive traces. For example, conductive traces with finer or thinner profile can be formed, leading to fine linewidth/space trace routing. Fine linewidth/space trace routing is advantageous as it enables higher routing density and more complex signal interconnection to be achieved. Moreover, it allows the location of package contacts or via contacts to be flexibly designed according to various customers' needs.

Furthermore, as described in embodiments of FIGS. 1-2, the package substrate includes a plurality of via contacts held together and surrounded by the base substrate. As such, the via contacts will not be detached easily. This allows for improved robustness and reliability, relative to other types of packages. Furthermore, the second surface of the via contacts, in one embodiment, is disposed below or recessed with respect to the second surface of the base substrate. Such configuration is advantageous as it provides recesses or pockets for better receiving of package contacts. The method as described in FIGS. 7a-l enables package substrate which includes via contacts in the die and non-die regions to be formed. As such, the package substrate serves as fan-in and fan-out redistribution structure for the die contacts, enabling redistributed external package connections. This leads to an increased number of I/O to be available in a given package area. The method as described involves relatively low manufacturing cost and may potentially be used to replace BGA substrate. In addition, the package substrate includes package contacts and via contacts. The combination of the package contacts and the via contacts as described may improve the package board level reliability performance due to improved stand-off height. The process as described in FIGS. 7a-l may also be modified for flip chip applications. In embodiments where the first surface of the cap is substantially coplanar with the inactive surface of the flip chip, the inactive surface of the flip is exposed for dissipating heat. Such package has improved thermal performance. Additionally, such configuration also allows for inclusion of additional heat sink or heat spreader to further enhance heat dissipation.

FIGS. 8a-j show another embodiment of a process for forming a semiconductor package. The process is similar to that described in FIGS. 7a-l. As such, common elements may not be described or described in detail.

Figure 8A:
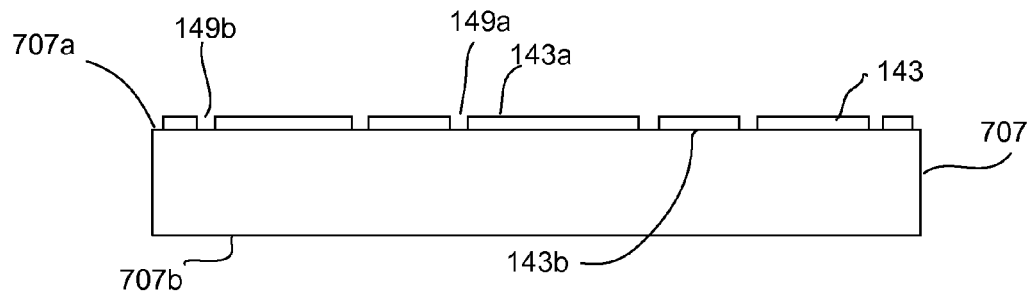

In one embodiment, a first conductive layer 143, such as a nickel layer, having first and second type openings 149a-b is formed over the first surface 707a of the conductive carrier. For example, the first conductive layer 143 having first and second type openings 149a-b as shown in FIG. 8a is formed by plating or other suitable methods as described in FIG. 7b.

Figure 8B:
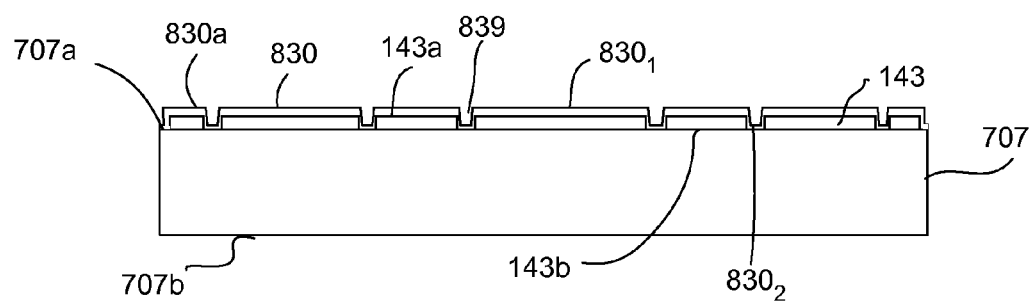

The process continues to form conductive traces or routings of the package substrate as shown in FIG. 8b. For example, electrochemical or electroless plating may be employed to form the conductive traces. In one embodiment, a second conductive layer 830, which includes the same material as the conductive carrier, such as copper, is blanket plated over the first conductive layer 143, lining the sides/edges and first surface 143a of the first conductive layer as well as bottom of the openings 149a to form the conductive trace layer 830. Other suitable types of conductive material may also be useful. The thickness of the plated conductive trace layer, for example, is about 50-150 μm. The thickness of the plated conductive trace layer, for example, may also be as low as about 10 μm. Other suitable thicknesses may also be useful. As shown, the plated conductive trace layer follows the topography of the first conductive layer and lines the bottom of the openings. As a result of the blanket plating process, the second conductive layer includes first portions $830_1$ which are planar and disposed over the first surface of the first conductive layer and second portions $830_2$ which may be referred to as recessed portions disposed in the first and second type openings 149a-b of the first conductive layer as shown in FIG. 8b.

Figure 8C:
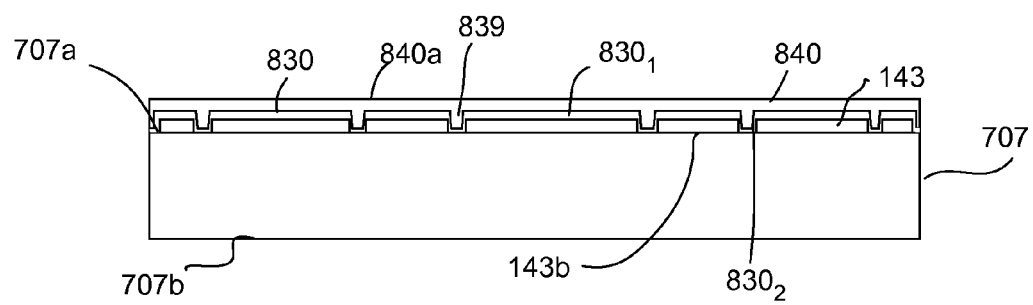
Figure 8D:
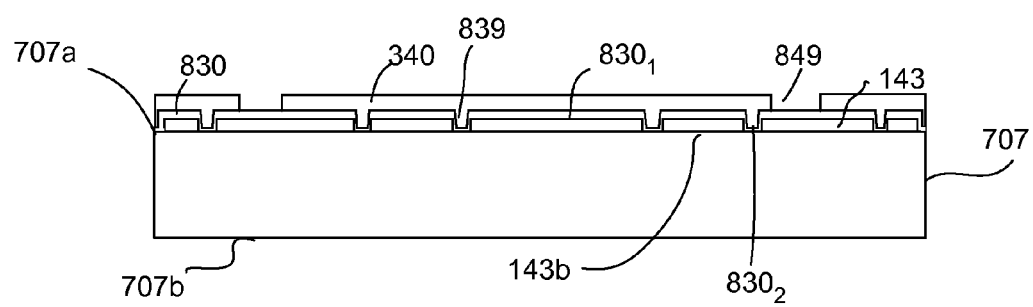

The process continues by forming a dielectric layer 840 over the second conductive layer 830. In one embodiment, the dielectric layer includes a solder mask. Providing other types of dielectric material may also be useful. The solder mask, in one embodiment, is formed by technique such as dispensing, laminating or screen printing. Other suitable types of technique may be used. The solder mask covers sides/edges and first surface 830a of the second conductive layer and fill the recesses 839 of the second conductive layer. The solder mask, as formed, includes a planar first surface 840a as shown in FIG. 8c.

The process continues to remove portions of the dielectric layer 840. In one embodiment, portions of the dielectric layer may be removed by exposure and development techniques to create openings 849. Other suitable techniques may also be employed to remove portions of the dielectric layer to form the openings 849.

Figure 8E:
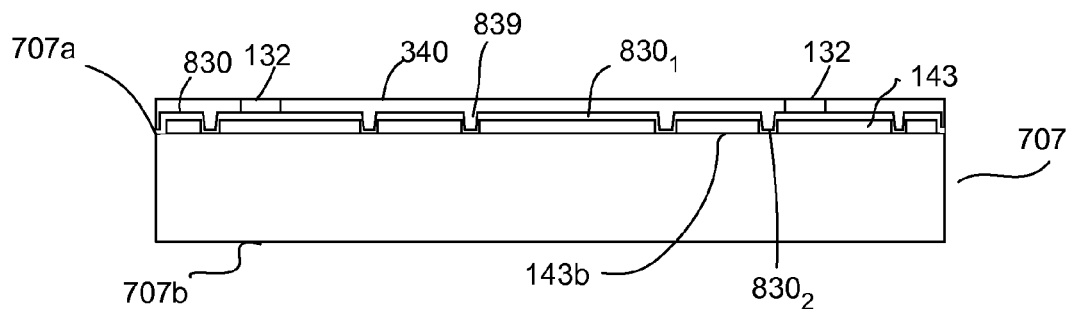

Referring to FIG. 8e, the process continues to form bond pads 132 over, for example, portions of the second conductive layer. In one embodiment, bond pads are formed in the openings 849 of the dielectric layer. In one embodiment, the bond pads are formed by a plating process. A conductive layer, which may include the same material as the conductive carrier and traces, such as copper, may be selectively plated over the exposed portions of the first surface 830a of the conductive trace layer not covered by the dielectric layer 340 to form the bond pads. As such, the dielectric layer also serves as a plating mask. The first surface of the conductive trace layer also serves as a base or substrate for the electroplating process for forming the bond pads. The thickness of the plated bond pads, for example, is about 0.01-1.5 μm. Other suitable thicknesses and materials, for example, similar to that described in FIG. 7f, may also be useful.

Figure 8F:
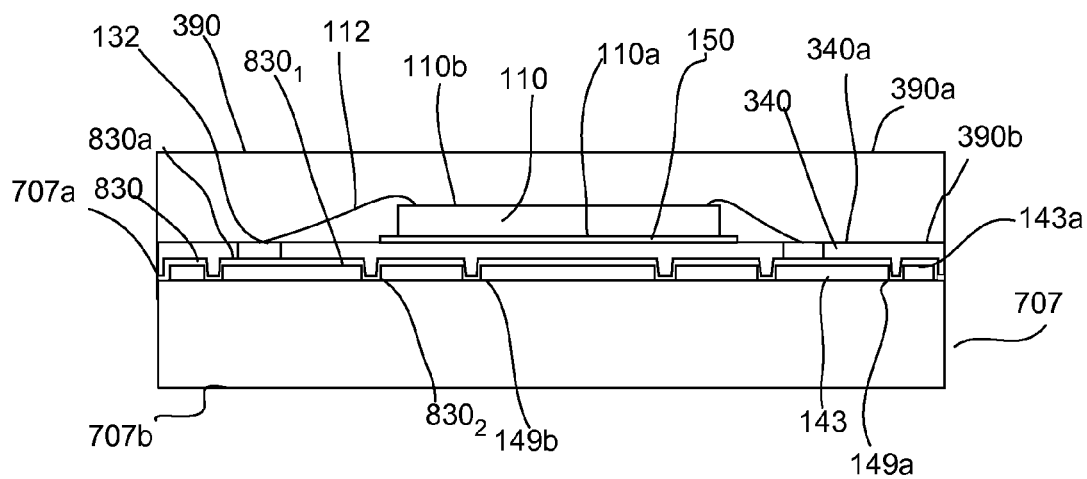

A die 110 which includes circuit components similarly described in FIG. 7h is attached by an adhesive layer 150 to the die region of the package substrate as shown in FIG. 8f. For example, wire bonds 112 are formed to create electrical connection between the bond pads 132 which are coupled to the conductive trace layer 830 on the package substrate and die pads on the die. A cap 390 is formed to encapsulate the die and wire bonds and a second surface 390b of the cap contacts the planar first surface 340a of the dielectric layer. Features of the die, wire bonds, cap and the process involved are similar to that described in FIG. 7h. As such, these process steps will not be described or described in detail.

Figure 8G:
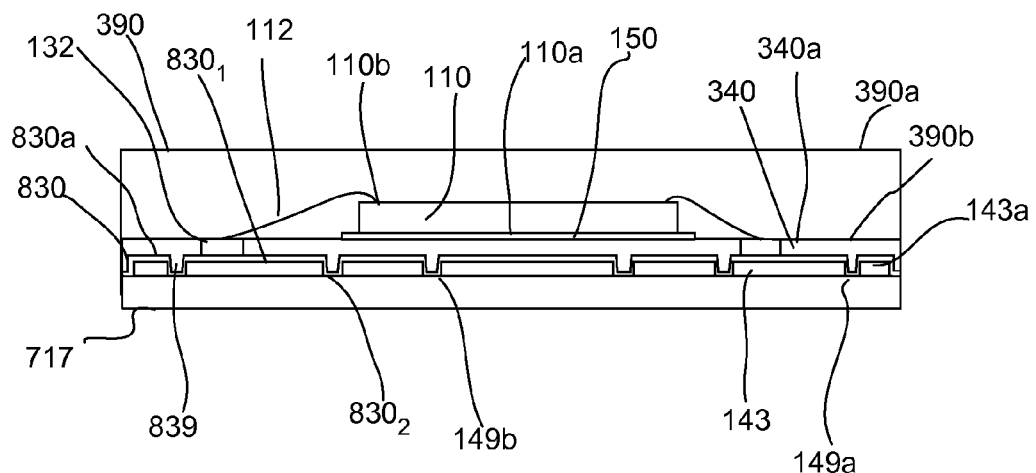

Referring to FIG. 8g, the second surface 707b of the conductive carrier is processed. In one embodiment, portions of the conductive carrier are thinned or removed up to a desired thickness by suitable techniques as described in FIG. 7i. As such, these process steps will not be described or described in detail.

Figure 8H:
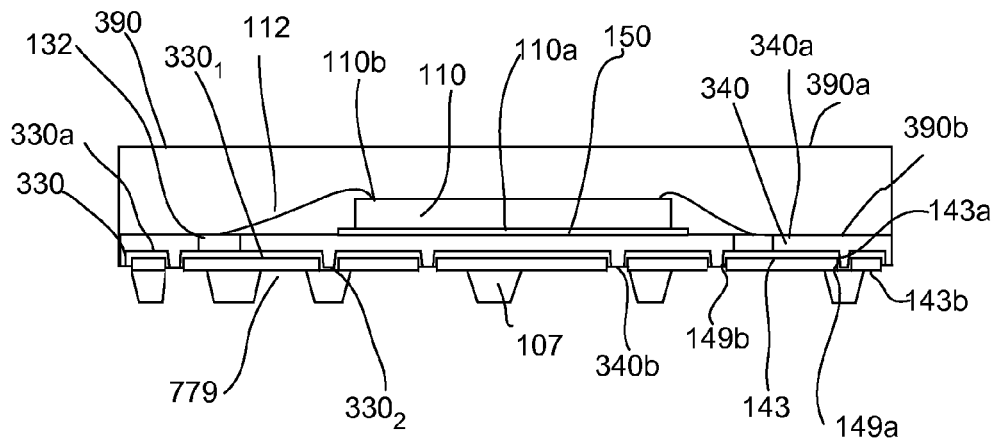

The process continues to form via contacts 107 and define conductive traces 330 of the package substrate as shown in FIG. 8h. In one embodiment, the via contacts of the package substrate are formed by patterning the remaining conductive carrier using suitable techniques as described in FIG. 7j. For example, patterning of the conductive carrier can be achieved by any suitable etching techniques. For example, a patterned etch mask (not shown), such as photoresist, is provided over the second surface 717 of the thinned conductive carrier. An etch may be performed using the etch mask to remove portions of the conductive carrier unprotected by the etch mask to form via contacts 107 and openings 779 separating the via contacts. The etch, for example, stops on the second surface 143b of first conductive layer while forming the via contacts. Thus, the first conductive layer also serves as an etch stop layer during formation of the via contacts so that the etch would not over etch the conductive trace layer in non-via contact regions of the package substrate. The etch, for example, may be an isotropic etch, such as a wet etch. Other techniques for patterning the conductive carrier may also be useful.

As described earlier, the conductive trace layer also lines the side/edges of the first conductive layer and bottom of the second type openings 149b of the first conductive layer. Since the conductive trace layer and the conductive carrier include the same material, the etch also removes portions of the recessed portions of the conductive trace layer which line the bottom of the second type openings 149b of the first conductive layer, exposing protruded portions of the dielectric layer in the second type openings as shown in FIG. 8h. Conductive traces 330 of the package substrate as well as isolation of the conductive traces are thus defined. As such, via contacts and conductive traces are simultaneously formed or defined by the same etch.

The thickness of the via contacts as formed, for example, is substantially the same as the thickness of the thinned conductive carrier. The via contacts, for example, may also include other suitable thicknesses. The via contacts 107 are directly coupled to the conductive traces 330 in the via contact regions of the package substrate. As shown, the first type openings 149a in the first conductive layer allows the via contacts to be directly coupled to the recessed portions of the conductive traces to form interconnect structures of the package substrate.

After patterning the conductive carrier, the mask is removed. The mask, for example, may be removed by ashing. Other techniques for removing the mask may also be useful.

Figure 8I:
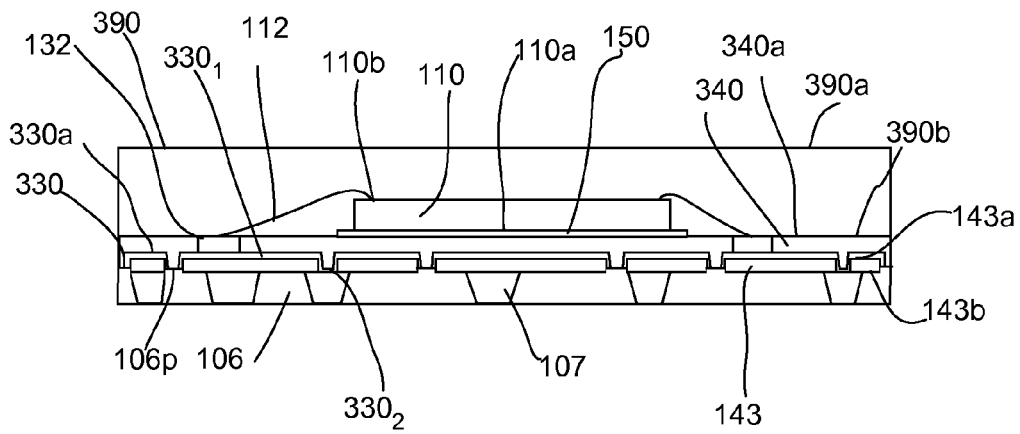

Second type openings 149b of the first conductive layer expose portions of the sides of the first conductive layer and protruded portions of the second surface 340b of the dielectric layer after the etch. An insulating layer 106, in one embodiment, is provided, filling the spaces 779 between the via contacts and partially filling the second type openings 149b between the first conductive layer as shown in FIG. 8i. As shown, the insulating layer includes protruded portions 106p which contact portions of the second surface of the dielectric layer. The insulating layer isolates the via contacts. In one embodiment, the insulating layer includes a dielectric material such as solder mask. The insulating layer, for example, may be formed by any suitable types of dielectric materials and techniques. The insulating layer formed in between the via contacts may be referred to as the base substrate 106 of the package substrate.

The second surface 107b of the via contacts, in one embodiment, may be substantially coplanar or non-coplanar with the second surface of the base substrate, similar to that described in FIG. 7k.

Figure 8J:
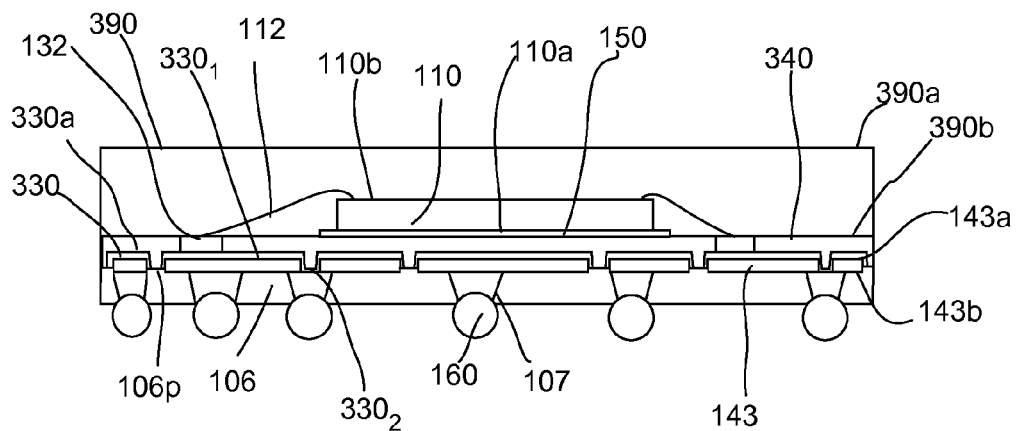

The process continues by forming package contacts 160 coupled to the via contacts, as shown in FIG. 8j. For example, the package contacts are formed on the second surface of the via contacts of the package substrate, similar to that described in FIG. 7l. As such, common features will not be described or described in detail. A semiconductor package such as that shown in FIG. 3 is formed.

Figure 9A:
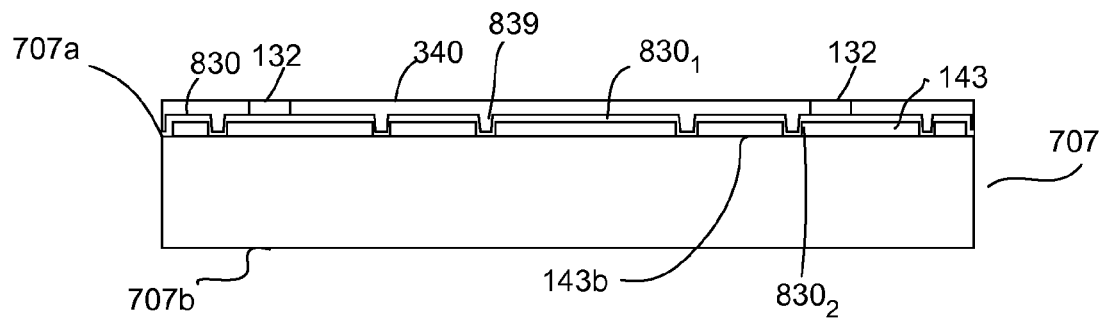

FIGS. 9a-f show another embodiment for forming a semiconductor package. The process is similar to that described in FIGS. 7a-l and FIGS. 8a-j. Referring to FIG. 9a, a dielectric layer 340, such as solder mask, includes a planar first surface 340a and covers sides/edges and first surface 830a of the second conductive layer and fills the recesses 839 of the second conductive layer. Bond pads 132 are formed over portions of the second conductive layer in the openings 849 of the dielectric layer, the same as that described in FIG. 8e. As such, common elements may not be described or described in detail.

Figure 9B:
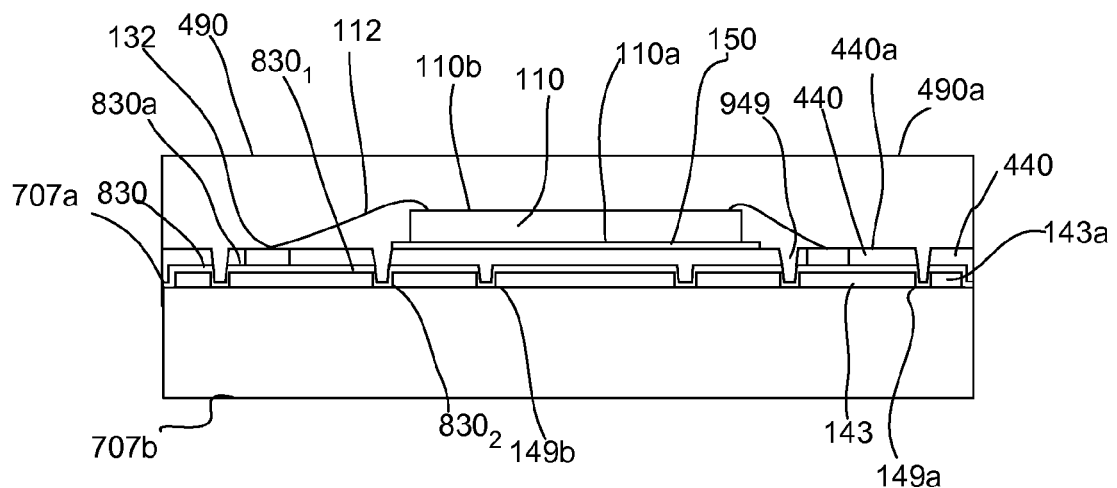

The process continues to remove portions of the dielectric layer as shown in FIG. 9b. In one embodiment, portions of the dielectric layer 340 in the recesses 839 of the second conductive layer 830 are removed, exposing recessed portions of the conductive trace layer in the non-die region of the package substrate. Portions of the dielectric layer, for example, may be removed by patterning the dielectric layer. For example, a patterned etch mask (not shown), such as photoresist, is provided over the first surface of the dielectric layer. An etch may be performed using the etch mask to remove portions of the dielectric layer. The etch, for example, stops on the recessed portions 830$_2$ of second conductive layer 830 while forming openings 949 in the dielectric layer 440. Thus, the recessed portions 830$_2$ of the second conductive layer also serves as an etch stop layer during removal of portions of the dielectric layer. The etch, for example, may be an isotropic etch, such as a wet etch. Other techniques for patterning the dielectric layer may also be useful.

The process continues by attaching a die 110 similarly described in FIG. 7h over an adhesive layer 150 prepared in the die region 105a of the package substrate as shown in FIG. 9b. Wire bonds 112, for example, are formed to create electrical connection between the bond pads which are coupled to the conductive trace layer and die pads on the die. A cap 490 is formed to encapsulate the die and wire bonds. In one embodiment, the second surface of the cap 490b contacts the planar first surface 440a of the dielectric layer 440 while portions of the material of the cap also fills the openings 949 in the dielectric layer and recesses 839 formed by the second conductive layer. Features of the die, wire bonds, cap and the process involved are similar to that described in FIG. 7h. As such, these process steps will not be described or described in detail.

Figure 9C:
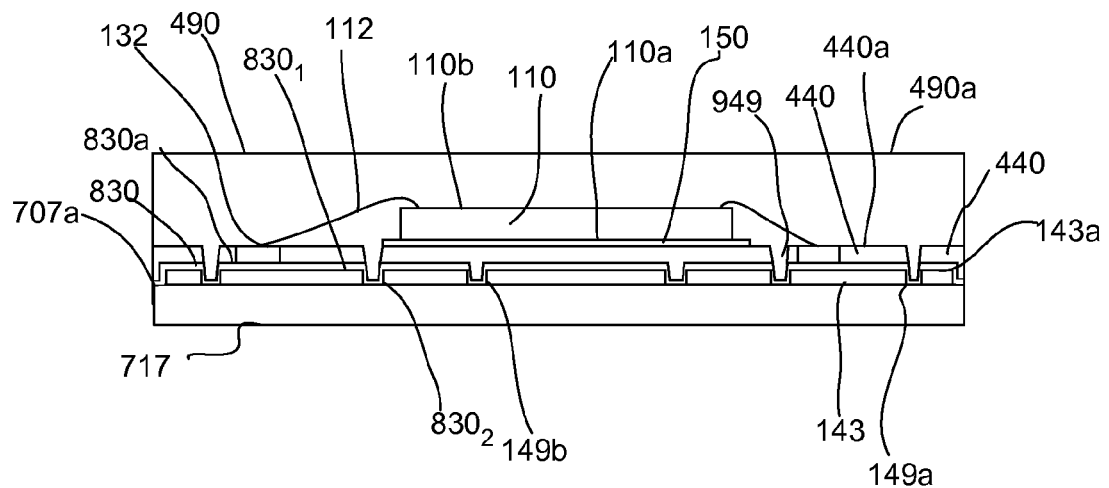

Referring to FIG. 9c, the second surface 707b of the conductive carrier is processed, similar to that described in FIGS. 7i and 8g. In one embodiment, portions of the conductive carrier in thinned or removed up to a desired thickness by suitable techniques as described in FIG. 7i. As such, these process steps will not be described or described in detail.

Figure 9D:
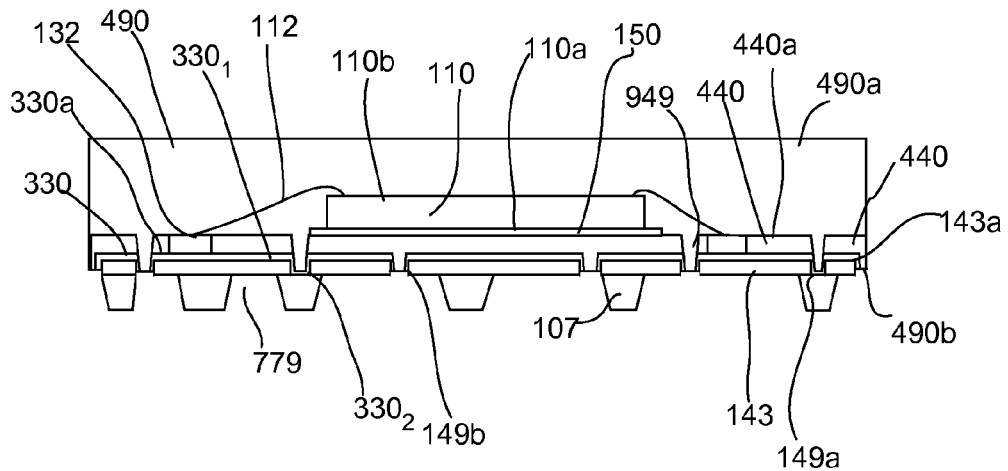

The process continues to form via contacts 107 and conductive traces 330 of the package substrate as shown in FIG. 9d using suitable techniques, such as an etch process, as described in FIG. 7j and FIG. 8h. For example, the etch may be performed using the etch mask to remove portions of the conductive carrier unprotected by the etch mask to form via contacts 107 and openings 779 separating the via contacts. The etch, for example, stops on the second surface 143b of the first conductive layer in non-via contact regions while forming via contacts 107 in the via contact regions. Thus, the first conductive layer also serves as an etch stop layer during formation of the via contacts so that the etch would not over etch the conductive trace layer in the non-via contact regions of the package substrate. Since the conductive trace layer and the conductive carrier include the same material, the etch also removes portions of the recessed portions $830_2$ of the conductive trace layer which line the bottom of the second type openings 149b of the first conductive layer, exposing protruded portions of the cap material in the second type openings as shown in FIG. 9d. Conductive traces 330 of the package substrate as well as isolation of the conductive traces are thus defined. As such, via contacts and conductive traces are simultaneously formed or defined by the same etch.

The via contacts 107 are directly coupled to the conductive traces 330 in the via contact regions of the package substrate. As shown, the first type openings 149a in the first conductive layer allows the via contacts to be directly coupled to the conductive traces to form interconnect structures of the package substrate.

After patterning the conductive carrier, the mask is removed. The mask, for example, may be removed by ashing. Other techniques for removing the mask may also be useful.

Figure 9E:
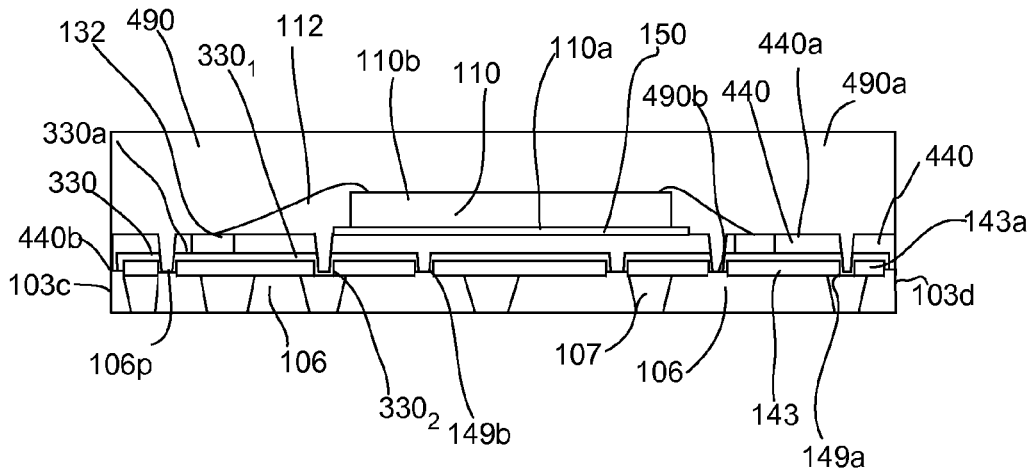

The second type openings 149b in the first conductive layer expose portions of the sides of the first conductive layer 143 and protruded portions of the second surface 490b of the cap after the etch. An insulating layer 106, in one embodiment, is provided, filling the openings 779 between the via contacts 107 and partially filling the second type openings 149b of the first conductive layer, forming protruded portions 106p as shown in FIG. 9e. As shown, the protruded portions 106p of the insulating layer also contact protruded portions of the cap in the second type openings and portions of the second surface 440b of the dielectric layer at peripheries 103c-d of the package substrate. The insulating layer isolates the via contacts. In one embodiment, the insulating layer includes a dielectric material such as solder mask. Providing the insulating layer with the same material as the cap may also be useful. The insulating layer, for example, may be formed by any suitable types of dielectric materials and techniques. The insulating layer formed in between the via contacts may be referred to as the base substrate 106 of the package substrate.

Figure 9F:
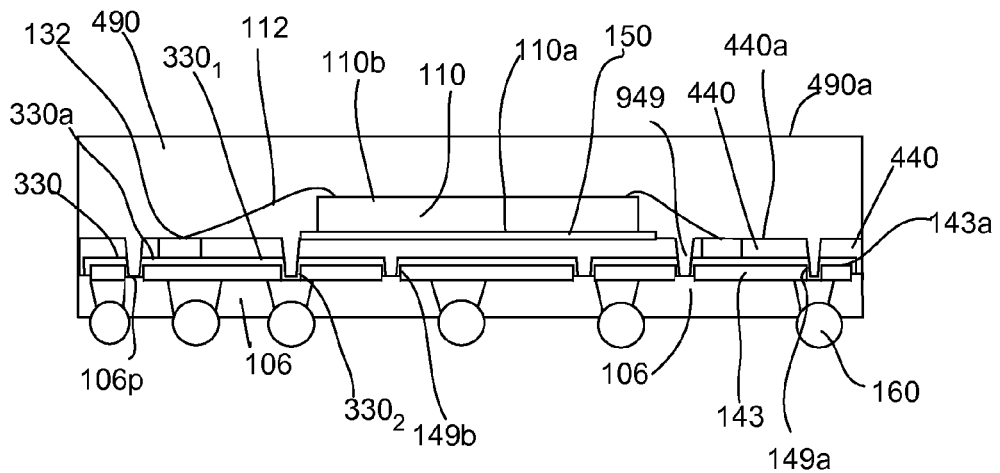

The process continues by forming package contacts 160 coupled to the via contacts 107, as shown in FIG. 9f. For example, the package contacts are formed on the second surface 107b of the via contacts, which may be substantially coplanar or non-coplanar with the second surface 106b of the base substrate, similar to that described in FIG. 7l. As such, common features will not be described or described in detail. A semiconductor package such as that shown in FIG. 4 is formed.

Figure 10A:
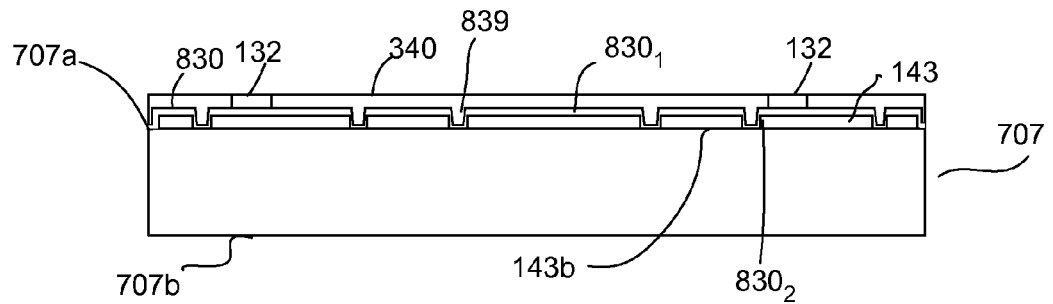

FIGS. 10a-f show another embodiment for forming a semiconductor package. The process is similar to that described in FIGS. 7a-l, FIGS. 8a-j and FIGS. 9a-f. Referring to FIG. 10a, the process is at the stage similar to that described in FIG. 8e and FIG. 9a. As such, common elements may not be described or described in detail.

Figure 10B:
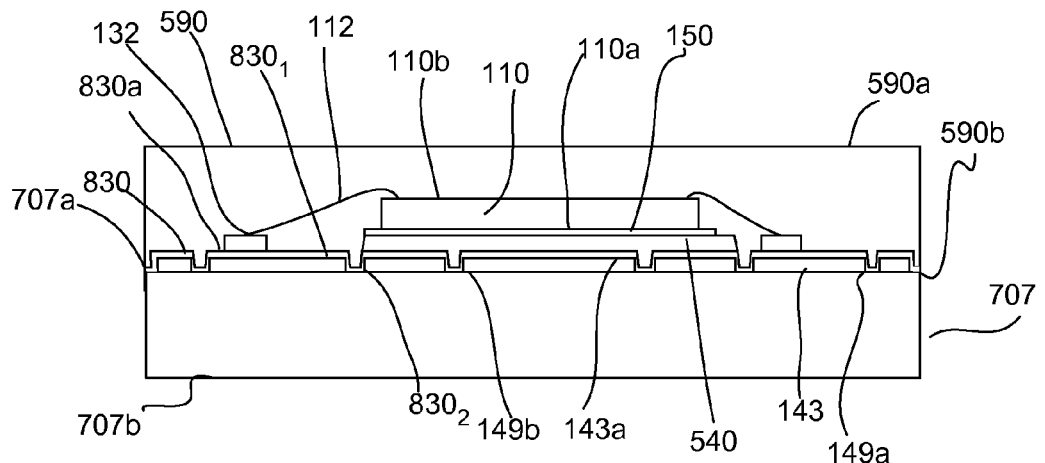

Referring to FIG. 10b, the process continues to remove portions of the dielectric layer 340. In one embodiment, portions of the dielectric layer are removed while portions of the dielectric layer 540 in the die region of the package substrate remains. Thus, portions of the second conductive layer 830 in the non-die region of the package substrate and the bond pads 132 are exposed. Portions of the dielectric layer, for example, may be removed by suitable techniques as described in FIG. 9b. As such, these process steps and features may not be described or described in detail.

The process continues by attaching a die 110 similarly described in FIG. 7h over an adhesive layer 150 prepared in the die region 105a of the package substrate as shown in FIG. 10b. Wire bonds 112, for example, are formed to create electrical connection between the bond pads 132 which are coupled to the conductive trace layer 830 and die pads on the die. A cap 590 is formed to encapsulate the die and wire bonds. In one embodiment, the second surface 590b of the cap contacts the first surface 830a of the conductive trace layer while portions of the material of the cap also fills the recesses 839 formed by the second conductive layer. Features of the die, wire bonds, cap and the process involved are similar to that described in FIG. 7h. As such, these process steps will not be described or described in detail.

Figure 10C:
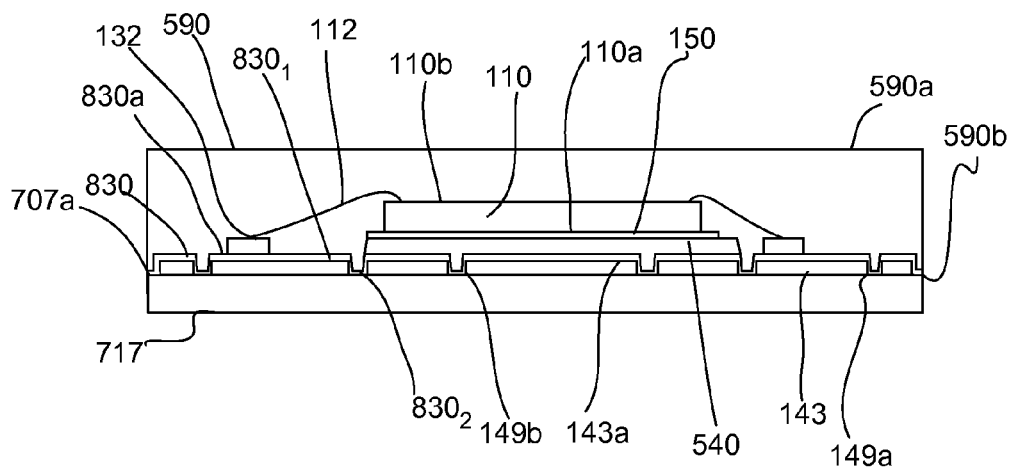

Referring to FIG. 10c, the second surface 707b of the conductive carrier 707 is processed, similar to that described in FIGS. 7i, 8g and 9c. In one embodiment, portions of the conductive carrier in thinned or removed up to a desired thickness by suitable techniques as described in FIG. 7i. As such, these process steps will not be described or described in detail.

Figure 10D:
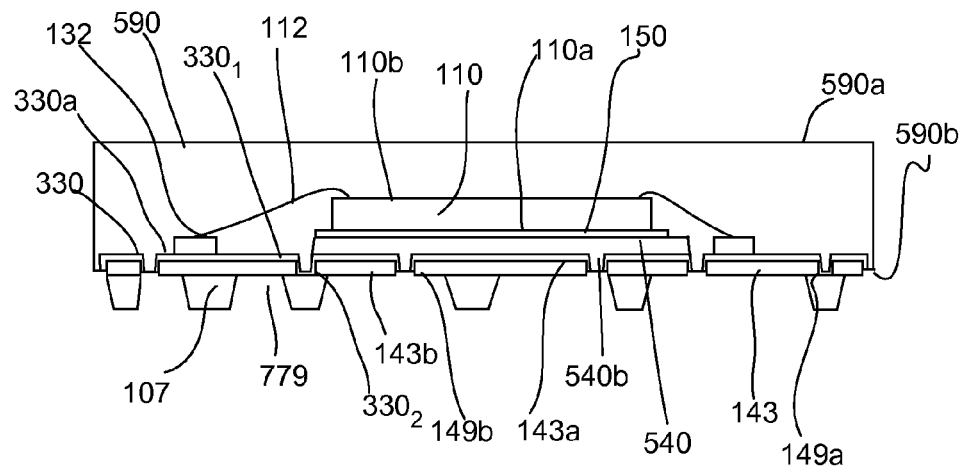

The process continues to form via contacts 107 and conductive traces 330 of the package substrate as shown in FIG. 10d using suitable techniques, such as an etch process, as described in FIG. 7j, FIG. 8h and FIG. 9d. For example, the etch may be performed using the etch mask to remove portions of the conductive carrier unprotected by the etch mask to form via contacts 107 and openings 779 separating the via contacts. The etch, for example, stops on the second surface 143b of the first conductive layer in non-via contact regions while forming via contacts 107 in the via contact regions. The etch also removes portions of the recessed portions $830_2$ of the conductive trace layer which line the bottom of the second type openings 149b of the first conductive layer, exposing protruded portions of the cap material in the second type openings 149b and at the peripheries 103c-d of the package substrate and protruded portions of the second surface of the dielectric layer 540b in the die region 105a as shown in FIG. 10d. Conductive traces 330 of the package substrate as well as isolation of the conductive traces are thus defined. As such, via contacts and conductive traces are simultaneously formed or defined by the same etch.

The via contacts 107 are directly coupled to the conductive traces 330 in the via contact regions of the package substrate. As shown, the first type openings 149a in the first conductive layer allows the via contacts to be directly coupled to the conductive traces to form interconnect structures of the package substrate.

After patterning the conductive carrier, the mask is removed. The mask, for example, may be removed by ashing. Other techniques for removing the mask may also be useful.

Figure 10E:
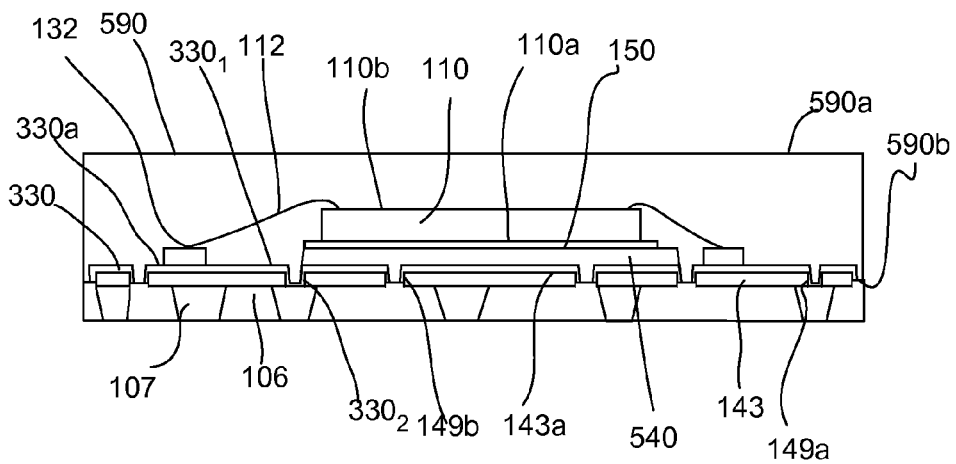

Second type openings 149b of the first conductive layer expose portions of the sides of the first conductive layer 143 and protruded portions of the second surface 590b of the cap after the etch. An insulating layer 106, in one embodiment, is provided, filling the openings 779 between the via contacts and partially filling the second type openings 149b of the first conductive layer, forming protruded portions 106p as shown in FIG. 10e. As shown, the protruded portions 106p of the insulating layer also contact protruded portions of the second surface 590b of the cap in the second type openings 149b and at the peripheries 103c-d of the package substrate as well as protruded portions of the second surface 540b of the dielectric layer in the die region 105a. The insulating layer isolates the via contacts. Materials and process of forming the insulating layer are similar to that described in FIG. 9e. As such, details of the materials and process will not be described or described in detail.

Figure 10F:
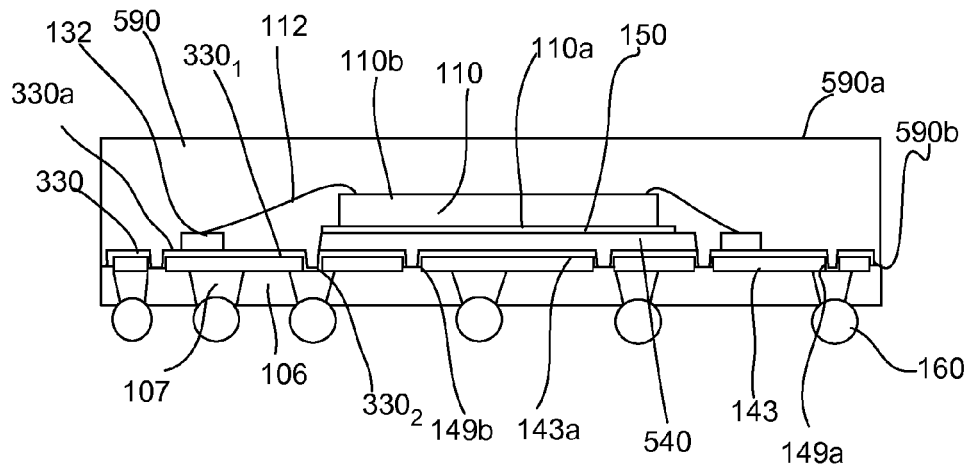

The process continues by forming package contacts 160 coupled to the via contacts 107, as shown in FIG. 10f. The package contacts, for example, are formed on the second surface 107b of the via contacts, which may be substantially coplanar or non-coplanar with the second surface 106b of the base substrate, similar to that described in FIG. 7l. As such, common features will not be described or described in detail. A semiconductor package such as that shown in FIG. 5 is formed.

Figure 11A:
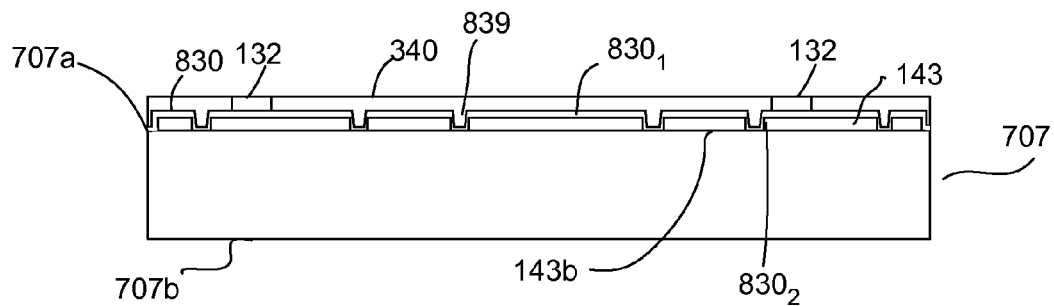

FIGS. 11a-f show another embodiment for forming a semiconductor package. The process is similar to that described in FIGS. 7a-l, FIGS. 8a-j, FIGS. 9a-f and FIGS. 10a-f. Referring to FIG. 11a, the process is at the stage similar to that described in FIG. 8e, FIG. 9a and FIG. 10a. As such, common elements may not be described or described in detail.

Figure 11B:
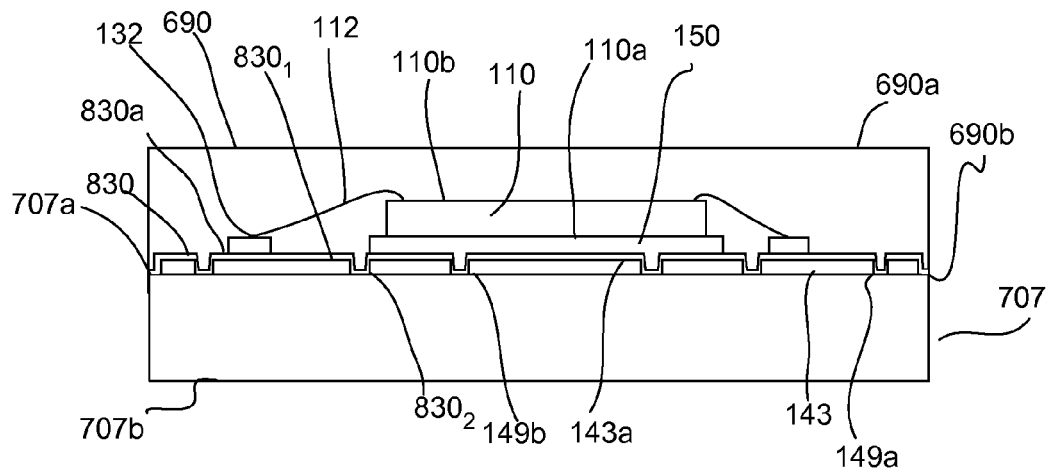

Referring to FIG. 11b, the process continues to remove the dielectric layer 340. In one embodiment, the entire dielectric layer 340 is removed. Thus, the first surface 830a of the second conductive layer 830 and the bond pads 132 are exposed. The dielectric layer 340, for example, may be removed by suitable techniques, such as an etch process, as described in FIG. 9b. As such, these process steps and features may not be described or described in detail. The etch, for example, stops on the first surface 830a of the second conductive layer and the bond pads.

The process continues by attaching a die 110 similarly described in FIG. 7h over an adhesive layer 150 prepared in the die region 105a of the package substrate as shown in FIG. 11b. Wire bonds 112, for example, are formed to create electrical connection between the bond pads which are coupled to the conductive trace layer 830 and die pads on the die. A cap 690 is formed to encapsulate the die and wire bonds. In one embodiment, the second surface 690b of the cap contacts the first surface 830a of the conductive trace layer while portions of the material of the cap also fill the recesses 839 formed by the second conductive layer 830. Features of the die, wire bonds, cap and the process involved are similar to that described in FIG. 7h. As such, these process steps will not be described or described in detail.

Figure 11C:
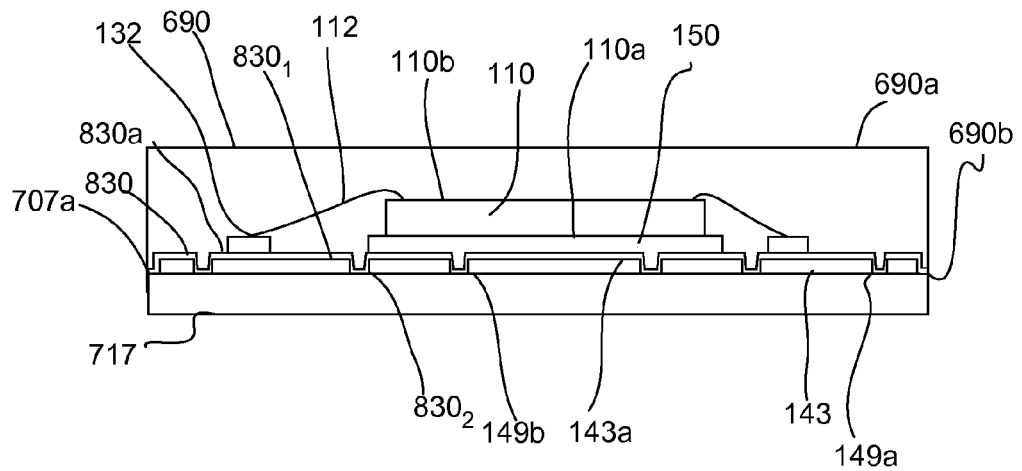

Referring to FIG. 11c, the second surface 707b of the conductive carrier is processed, similar to that described in FIGS. 7i, 8g, 9c and 10c. In one embodiment, portions of the conductive carrier in thinned or removed up to a desired thickness by suitable techniques as described in FIG. 7i. As such, these process steps will not be described or described in detail.

Figure 11D:
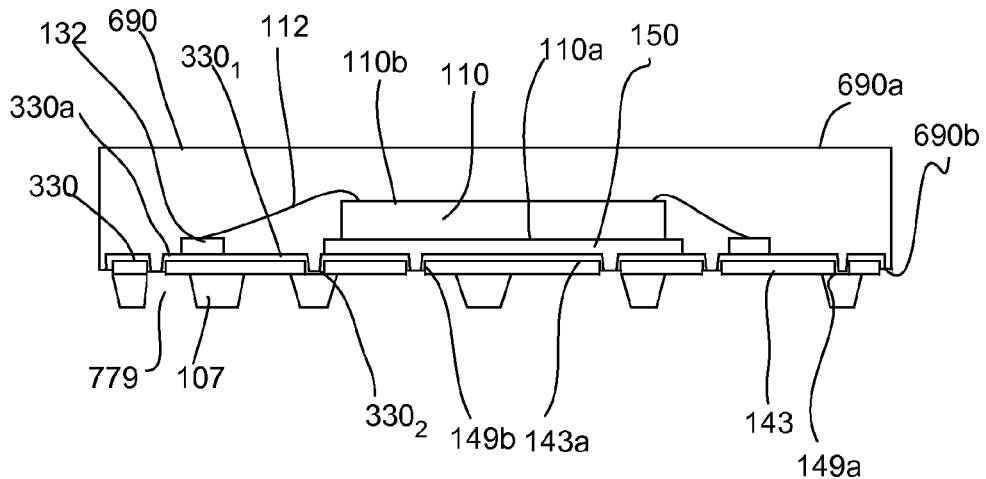

The process continues to form via contacts 107 and conductive traces 330 of the package substrate as shown in FIG. 11d using suitable techniques, such as an etch process, as described in FIG. 7j, FIG. 8h, FIG. 9d and FIG. 10d. For example, the etch may be performed using the etch mask to remove portions of the conductive carrier unprotected by the etch mask to form via contacts 107 and openings 779 separating the via contacts. The etch, for example, stops on the second surface 143b of the first conductive layer in non-via contact regions while forming via contacts 107 in the via contact regions. The etch also removes portions of the recessed portions 830₂ of the conductive trace layer which line the bottom of the second type openings 149b of the first conductive layer, exposing protruded portions of the cap material in the second type openings 149b in the non-die region 105b and at the peripheries 103c-d of the package substrate as well as portions of the adhesive layer 150 in the die region as shown in FIG. 11d. Conductive traces 330 of the package substrate as well as isolation of the conductive traces are thus defined. As such, via contacts and conductive traces are simultaneously formed or defined by the same etch.

The via contacts 107 are directly coupled to the conductive traces 330 in the via contact regions of the package substrate. As shown, the first type openings 149a in the first conductive layer allows the via contacts to be directly coupled to the conductive traces to form interconnect structures of the package substrate.

After patterning the conductive carrier, the mask is removed. The mask, for example, may be removed by ashing. Other techniques for removing the mask may also be useful.

Figure 11E:
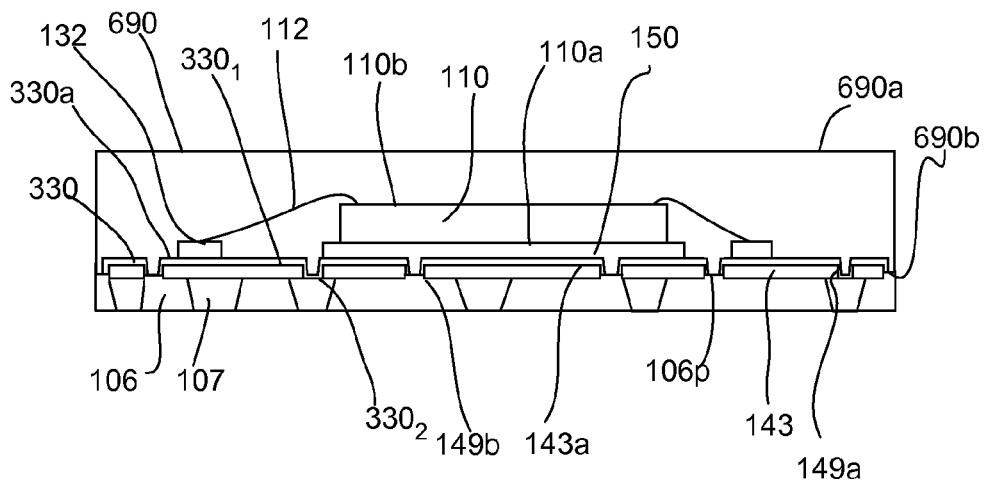

Second type openings 149b of the first conductive layer expose portions of the sides of the first conductive layer, protruded portions of the second surface 690b of the cap and portions of the second surface 330b of the conductive traces after the etch. An insulating layer 106, in one embodiment, is provided, filling the spaces 779 between the via contacts and partially filling the second type openings 149b of the first conductive layer, forming protruded portions 106p as shown in FIG. 11e. As shown, the protruded portions of the insulating layer also contact protruded portions of the second surface 690b of the cap in the second type openings 149b in the non-die region 105b and at the peripheries 103c-d of the package substrate and portions of the adhesive layer 150 in the die region 105a. The insulating layer isolates the via contacts. Materials and process of forming the insulating layer are similar to that described in FIG. 9e. As such, details of the materials and process will not be described or described in detail.

Figure 11F:
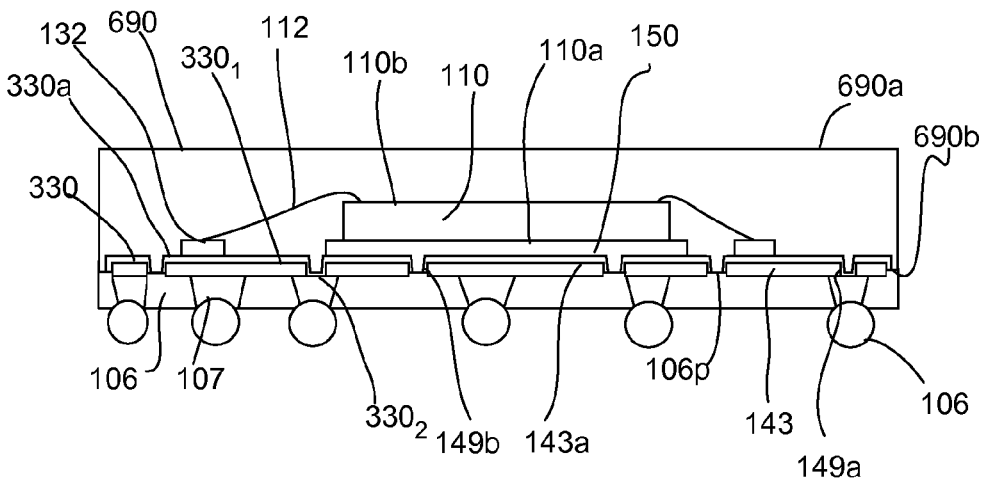

The process continues by forming package contacts 160 coupled to the via contacts 107, as shown in FIG. 11f. The package contacts, for example, are formed on the second surface of the via contacts, which may be substantially coplanar or non-coplanar with the second surface 107b of the base substrate, similar to that described in FIG. 7l. As such, common features will not be described or described in detail. A semiconductor package such as that shown in FIG. 6 is formed.

The embodiments described with respect to FIGS. 8a-j, FIGS. 9a-f, FIGS. 10a-f and FIGS. 11a-f include some or all advantages as described with respect to FIG. 7a-l. As such, these advantages will not be described or described in detail. The embodiments, as described with respect to FIGS. 8a-j, FIGS. 9a-f, FIGS. 10a-f and FIGS. 11a-f result in additional advantages. For example, as described in the embodiments of FIGS. 8a-j, FIGS. 9a-f, FIGS. 10a-f and FIGS. 11a-f, portions of the first surface 106a of the base substrate includes protruded portions 106p which partially occupy the second type openings 149*b* of the first conductive layer. As such, the second type openings 149*b* of the first conductive layer in the non-via contact regions of the package substrate provide more surface area for the base substrate to effectively hold the via contacts. As such, the reliability of the semiconductor package is further enhanced.

FIGS. 12*a-e* show another embodiment for forming a semiconductor package. The process is similar to that described in FIGS. 7*a-l*, FIGS. 8*a-j*, FIGS. 9*a-f*, FIGS. 10*a-f* and FIGS. 11*a-f*. As such, common elements may not be described or described in detail.

Figure 12A:
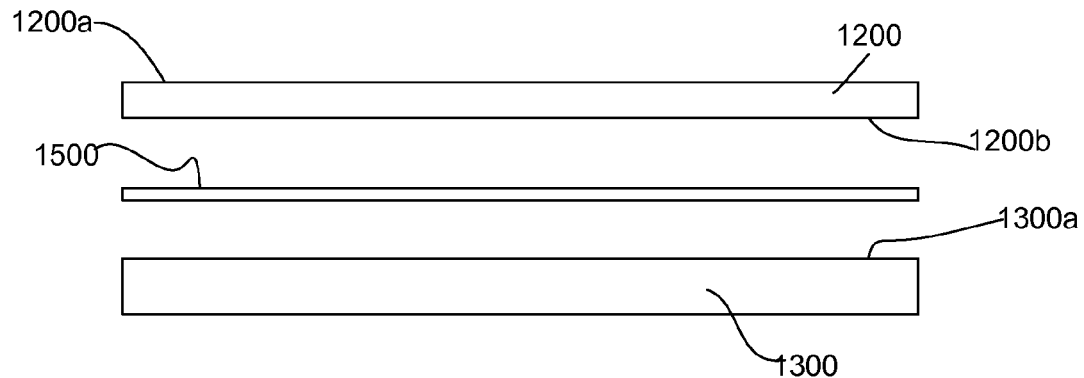

Referring to FIG. 12*a*, a base carrier or a leadframe 1200 is provided. The base carrier, in one embodiment, includes a conductive carrier having first and second major surfaces 1200*a-b*. The first and second major surfaces, for example, include planar surfaces. Providing any one of the major surfaces to be non-planar may also be useful. The conductive carrier, for example, includes Cu, Cu alloy, Fe or Ni—Fe alloy, similar to that described in FIG. 7*a*. Other suitable types of conductive materials may also be useful. In one embodiment, the thickness of the conductive carrier 1200 is substantially the same as the thickness of via contacts 107 of the package substrate to be formed. For example, the thickness of the conductive carrier is about 100-300 µm. Other suitable thicknesses may also be useful, depending on the desired thickness of the via contacts. The conductive carrier, for example, may serve as part of the interconnect structures, such as via contacts, of the package substrate as will be described later.

In one embodiment, the process continues by providing a support carrier 1300. The support carrier, for example, is a temporary carrier for processing the die package. The carrier should be sufficiently rigid to serve as a support and withstand further processing steps. By way of non-limiting example, the support carrier may be a silicon, standard steel, Cu or Cu alloy. Various types of materials may be used to form the support carrier.

In one embodiment, an adhesive 1500 is provided on a first surface 1300*a* of the support carrier to facilitate temporary bonding of the conductive carrier 1200 onto the support carrier 1300. Other temporary bonding techniques may also be useful. The adhesive, for example, can be any type of adhesive that provides temporary bonding of the conductive carrier. The adhesive may be in different forms. For example, the adhesive may be a tape, liquid or paste. The adhesive may be provided on the support carrier using various techniques. The technique employed may depend on the type or form of the adhesive. For example, a tape adhesive may be provided on the support carrier by lamination, a paste adhesive may be provided on the support carrier by printing while a liquid adhesive may be provided on the substrate by spin coating.

Figure 12B:
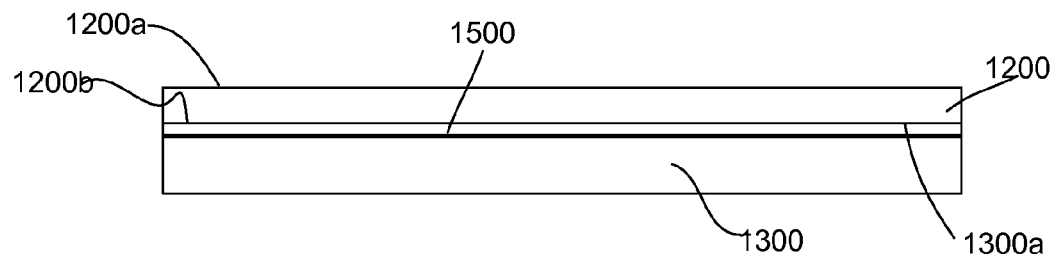

In one embodiment, the second surface 1200*b* of the conductive carrier is attached to the support carrier 1300 via the adhesive 1500 as shown in FIG. 12*b*. The conductive carrier is attached to the support carrier using any suitable techniques according to the equipment and type of adhesive used.

Figure 12C:
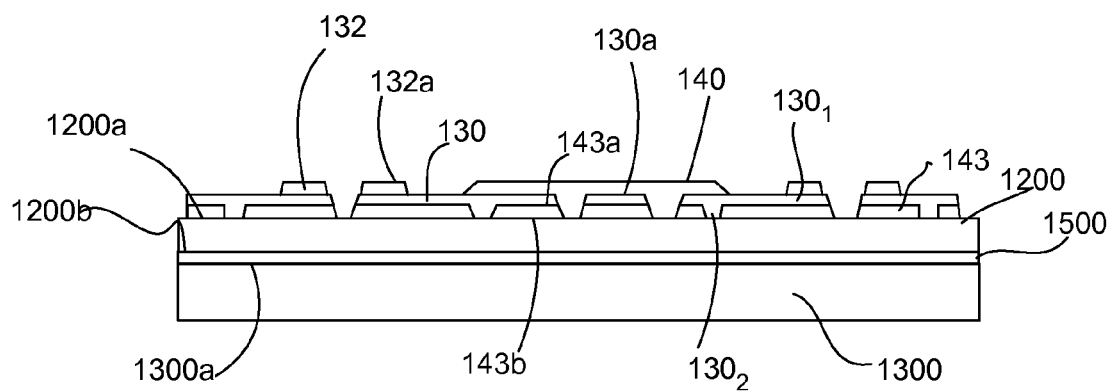

The process continues to form the first and second conductive layers with predefined openings and bond pads. In one embodiment, the process continues, as similarly described in FIGS. 7*b-g*, except that the conductive carrier having a thickness substantially the same as the thickness of a desired via contacts which is attached to the support carrier. As such, these process steps will not be described or described in detail. The process continues until a partially processed package substrate attached to the support carrier as shown in FIG. 12*c* is formed.

Figure 12D:
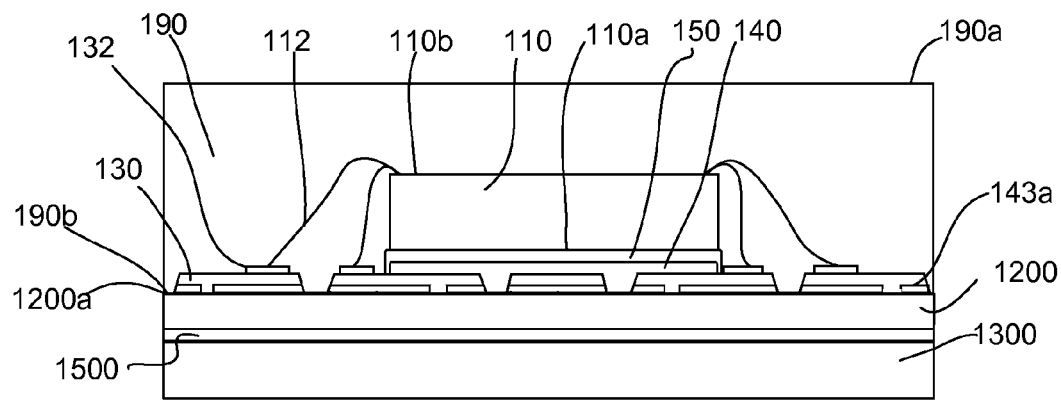

The process continues by attaching a die 110, electrically coupling the die to the conductive traces 130 by wire bonds and forming a cap 190 to encapsulate the die and wire bonds 112 as shown in FIG. 12*d*. Features of the die, wire bonds, cap and the process involved are similar to that described in FIG. 7*h* and thus the details will not be described or described in detail.

Figure 12E:
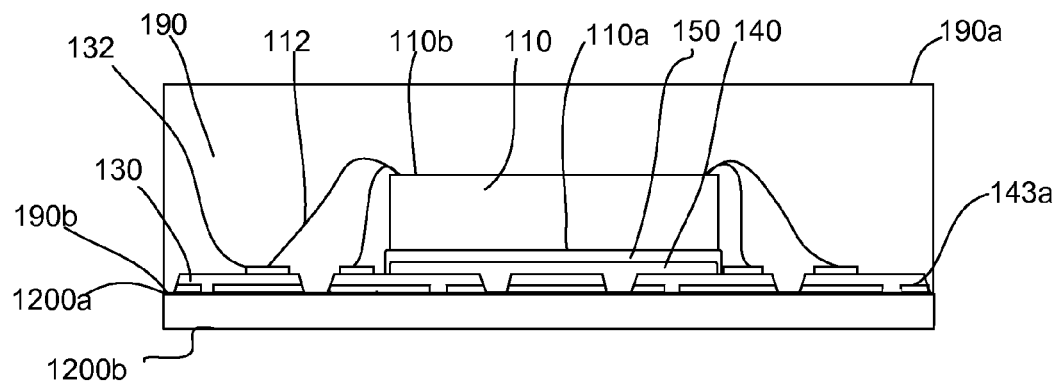

Referring to FIG. 12*e*, the support carrier 1300 and the adhesive 1500 are separated from the conductive carrier 1200 after forming the cap. In one embodiment, a debonding treatment is performed. The debonding treatment may, for example, cause the adhesive to lose or reduce its adhesive strength to allow separation of the die assembly from the support carrier. The debonding treatment, in one embodiment, includes a temperature or heat treatment. When heated to the debonding temperature, the adhesive loses or reduces its adhesive strength. Other types of debonding treatments may also be useful. The debonding treatment may depend on the type of adhesive used. The debonding treatment may include chemical treatment, such as applying a solvent to dissolve the adhesive, or a mechanical treatment, such as pulling or twisting, to separate the die assembly from the support carrier.

The partially processed package after the removal of the support carrier as shown in FIG. 12*e* is similar to the partially processed package as shown in FIG. 7*i*. In one embodiment, the thickness of the conductive carrier as shown in FIG. 12*e* has been pre-prepared according to the desired via contact thickness. As such, additional process to remove excess material of the conductive carrier is avoided.

The process continues to form via contacts, base substrate and package contacts, as similarly described in FIG. 7*j* and onwards. As such, these process steps will not be described or described in detail. The process continues until a package similar to that shown in FIG. 1 is formed.

The process as described in FIGS. 12*a-e* may be modified to produce packages as shown in FIGS. 3-6. For example, after the conductive carrier 1200 is attached to the support carrier 1300, the process of forming the first and second conductive layers, dielectric layer and bond pads as described in FIGS. 7*b-g* may be replaced by the process described in FIGS. 8*a-e* and further processing to form a partially processed package substrate as shown in FIG. 8*f*, FIG. 9*b*, FIG. 10*b* and FIG. 11*b*, omitting the step of removing excess material of the conductive carrier since the conductive carrier having a thickness substantially the same as the thickness of a desired via contacts has already been pre-prepared. As such, these process steps will not be described or described in detail. The process then continues from to remove the support carrier as described in FIG. 12*d* and onwards to until a complete semiconductor package such as that shown in FIG. 3, 4, 5 or 6 is formed.

FIGS. 13*a-d* show another embodiment for forming a semiconductor package. The process is similar to that described in FIGS. 7*a-l*, FIGS. 8*a-j*, FIGS. 9*a-f*, FIGS. 10*a-f*, FIGS. 11*a-f* and FIGS. 12*a-e*. As such, common elements may not be described or described in detail.

Figure 13A:
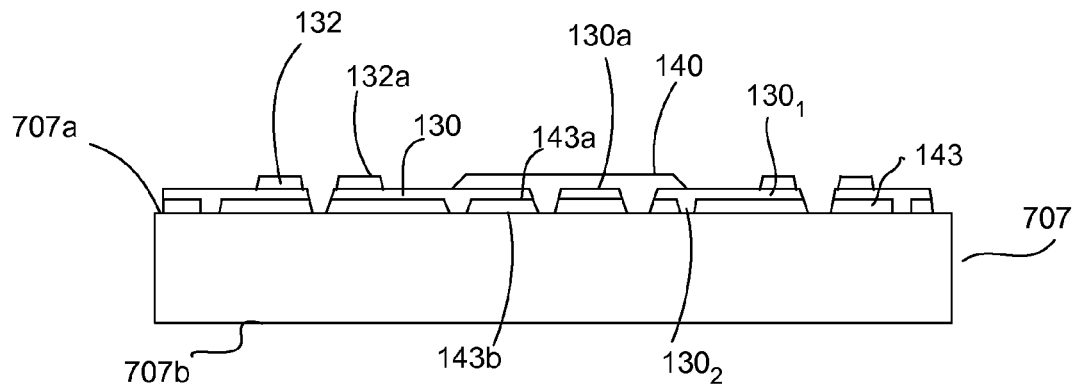

Referring to FIG. 13*a*, a partially processed package substrate is provided. The partially process package substrate is at the stage of processing as described in FIG. 7*g*. For example, first and second conductive layers with predefined openings and bond pads are formed over the conductive carrier 707. The partially processed package substrate may optionally include a dielectric layer 140, such as solder mask, in the die region 105*a* of the package substrate. As such, common features may not be described or described in detail.

Figure 13B:
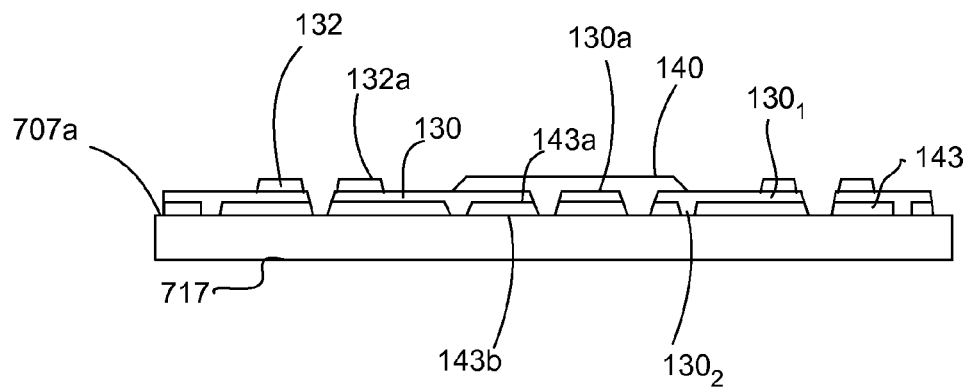

In one embodiment, the process continues by processing the second surface 707b of the conductive carrier. In one embodiment, portions of the conductive carrier 707 are removed. For example, the second surface 707b of the conductive carrier is patterned to remove excess material. For example, the conductive carrier is thinned or removed up to a suitable thickness. The conductive carrier may be thinned to a desired via contact thickness as shown in FIG. 13b. [The second major surface of the conductive carrier may be removed using etch, grinding or polishing technique. The etch, for example, includes wet etch/chemical etch. Other techniques for thinning the conductive carrier may also be useful.

Figure 13C:
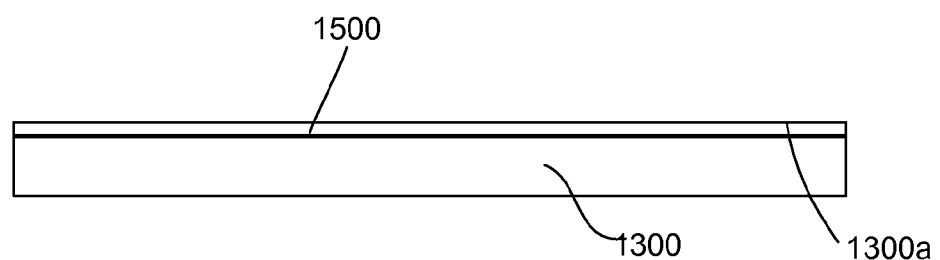

In one embodiment, the process continues by providing a support carrier 1300 as shown in FIG. 13c. The support carrier, for example, is a temporary carrier for processing the die package and an adhesive 1500 is provided on a first surface 1300a of the support carrier to facilitate temporary bonding of the partially processed package substrate onto the support carrier. The features of the support carrier and adhesive are the same as that described in FIG. 12a. As such, these features will not be described or described in detail.

Figure 13D:
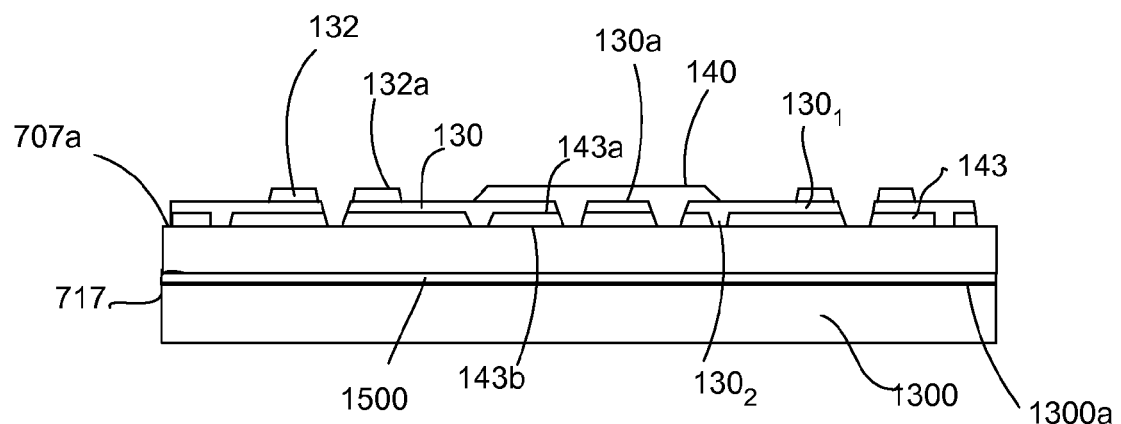

Referring to FIG. 13d, the process continues by attaching the partially processed package substrate to the support carrier 1300. For example, the second surface of the conductive carrier 717 is attached to the support carrier via the adhesive as shown in FIG. 13d. The resultant structure, as shown in FIG. 13d, is the same as that shown in FIG. 12c. As such, common features may not be described.

The process continues to complete the semiconductor package, as similarly described in FIGS. 12d-e and FIG. 7j and onwards. As such, these process steps will not be described or described in detail. The process continues until a package similar to that shown in FIG. 1 is formed.

The process as described in FIGS. 13a-d may be modified to produce packages as shown in FIGS. 3-6. For example, the partially process package as shown as described in FIG. 13a may be replaced by a partially processed package at the stage of processing described in FIG. 8e, 9a, 10a or 11a. The process then continues to further process the second surface of the conductive carrier as described in FIG. 13b. As such, these process steps will not be described or described in detail. The process then continues from FIG. 13b and onwards to until a complete semiconductor package such as that shown in FIG. 3, 4, 5 or 6 is formed.

The embodiments described with respect to FIGS. 12a-e and FIGS. 13a-d include some or all advantages as described with respect to FIG. 7a-l, FIGS. 8a-j, FIGS. 9a-f, FIGS. 10a-f and FIGS. 11a-f. As such, these advantages will not be described or described in detail. The embodiments, as described with respect to FIGS. 12a-e and FIGS. 13a-d result in further advantages. For example, in the embodiment described with respect to FIGS. 12a-e, a conductive carrier having a pre-defined thickness which is substantially the same as the thickness of the via contacts is pre-prepared. This eliminates the step of removing excess material of the conductive carrier to the thickness of the via contacts by an etch process which may result in overetching the conductive carrier and further reduces costs. Moreover, the use of a temporary carrier and adhesive as described in these embodiments provide sufficient support to the conductive carrier during assembly of the die package. The temporary carrier may be recycled after use and therefore provides a relatively cost savings method for producing the semiconductor package.

The processes, as described in FIGS. 7a-l, FIGS. 8a-j, FIGS. 9a-f, FIGS. 10a-f, FIGS. 11a-f, FIGS. 12a-e and FIGS. 13a-d include a wire bonded die. In another embodiment, the process may include a flip chip type of die. It is understood that modifications may be made to form contact pads which matches the die contacts of the flip chip die for flip chip applications. It is also understood that for flip chip application, first surface of the cap may be covering the inactive surface of the flip chip or substantially coplanar with the inactive surface of the flip chip. As such, details for flip chip application may not be described or described in detail.

The invention may be embodied in other specific forms without departing from the spirit or essential characteristics thereof. The foregoing embodiments, therefore, are to be considered in all respects illustrative rather than limiting the invention described herein.

What is claimed is:

1. A package substrate comprising:
   a base substrate having first and second major surfaces and a plurality of via contacts extending through the first to the second major surfaces of the base substrate;
   a first conductive layer disposed over and in direct contact with the first surface of the base substrate and via contacts, wherein the first conductive layer comprises a plurality of openings which are configured to match conductive trace layout of the package substrate; and
   conductive traces disposed over the first conductive layer, wherein the conductive traces are directly coupled to the via contacts through some of the openings of the first conductive layer.

2. The package substrate of claim 1 wherein:
   the via contacts and the conductive traces comprise a first conductive material; and
   the first conductive layer comprises a second conductive material which is different than the first conductive material, wherein the second conductive material comprises a material which provides etch selectivity between the first conductive layer and the via contacts.

3. The package substrate of claim 2 wherein:
   the first conductive material comprises copper and the second conductive material comprises nickel; and
   bottom surface of the conductive traces are only in direct contact with the first conductive layer, or
   bottom surface of the conductive traces are only in direct contact with the first conductive layer and via contacts.

4. A package substrate comprising:
   a base substrate having first and second major surfaces and a plurality of via contacts extending through the first to the second major surfaces of the base substrate;
   a first conductive layer having a plurality of openings disposes over the first surface of the base substrate and via contacts, wherein the openings are configured to match conductive trace layout of the package substrate and wherein the first major surface of the base substrate includes protruded portions which partially occupy some of the openings of the first conductive layer; and
   conductive traces disposes over the first conductive layer, wherein the conductive traces are directly coupled to the via contacts through some of the openings of the first conductive layer.

5. A semiconductor package comprising:
   a package substrate having first and second major surfaces, wherein the package substrate comprises a base substrate and a plurality of via contacts extending through the first to the second major surface of the package substrate;
   a first conductive layer disposed over and in direct contact with the base substrate and via contacts of the package substrate, wherein the first conductive layer comprises first and second type openings which are configured to match conductive trace layout of the package substrate;

conductive traces disposed over the first conductive layer, wherein the conductive traces are directly coupled to the via contacts through the first type openings of the first conductive layer;

a die having conductive contacts on its first or second surfaces disposed over a die region of the package substrate, wherein the conductive contacts of the die are electrically coupled to the conductive traces; and a cap disposed over the package substrate to encapsulate the die.

6. The semiconductor package of claim 5 wherein:
the via contacts and the conductive traces comprise a first conductive material; and
the first conductive layer comprises a second conductive material which is different than the first conductive material.

7. The semiconductor package of claim 6 wherein the first conductive material comprises copper and the second conductive material comprises nickel.

8. The semiconductor package of claim 5 wherein the base substrate comprises first and second surfaces, wherein the first surface of the base substrate comprises protrusions which partially occupy the second type openings of the first conductive layer.

9. The semiconductor package of claim 8 comprising a dielectric layer disposed over the conductive traces, wherein the dielectric layer isolates the conductive traces.

10. The semiconductor package of claim 9 wherein:
the dielectric layer comprises openings in a non-die region of the package substrate; and
the cap includes first and second major surfaces, wherein the second major surface of the cap comprises protrusions which occupy the openings of the dielectric layer.

11. The semiconductor package of claim 9 wherein the dielectric layer is disposed over the conductive traces in the die region of the package substrate.

12. The semiconductor package of claim 11 wherein:
the cap comprises first and second major surfaces; and
the second major surface of the cap comprises protruded portions which occupy openings separating the conductive traces.

13. The semiconductor package of claim 8 wherein:
the conductive traces comprise first portion and second portion; and
the first portion of the conductive traces is disposed over first surface of the first conductive layer while the second portion of the conductive traces lines sides and bottom of the first type opening of the first conductive layer which corresponds to a recessed portion of the conductive traces.

14. The semiconductor package of claim 13 wherein the conductive traces are directly coupled to the via contacts through the recessed portion of the conductive traces.

15. The semiconductor package of claim 14 comprising a dielectric layer disposed over the conductive traces in the die and non-die regions of the package substrate.

16. The semiconductor package of claim 15 wherein:
the dielectric layer comprises first and second type openings; and
the first type openings of the dielectric layer expose the recessed portion of the conductive traces while the second type openings of the dielectric layer expose surfaces of the protrusions of the base substrate.

17. The semiconductor package of claim 5 comprising an insulating layer which covers and fills spaces between the conductive traces in the die region of package substrate.

18. The semiconductor package of claim 5 wherein:
the cap comprises first and second major surfaces; and
portions of the second major surface of the cap comprise protruded portions which occupy the second type openings of the first conductive layer and spaces between the conductive traces.

19. The semiconductor package of claim 5 wherein the via contacts are disposed only in non-die regions of the package substrate.

20. The semiconductor package of claim 5 wherein the die comprises wire bonded type of die, flip chip or TSV type of die.

* * * * *